US009014222B2

(12) United States Patent
Beckett

(10) Patent No.: US 9,014,222 B2
(45) Date of Patent: Apr. 21, 2015

(54) DISCRETELY TUNABLE LASER DEVICE

(75) Inventor: Douglas J. S. Beckett, Kanata (CA)

(73) Assignee: Ranovus Inc., Ottawa, Ontario (CA)

( * ) Notice: Subject to any disclaimer, the term of this patent is extended or adjusted under 35 U.S.C. 154(b) by 214 days.

(21) Appl. No.: 13/585,986

(22) Filed: Aug. 15, 2012

(65) Prior Publication Data

US 2014/0050236 A1   Feb. 20, 2014

(51) Int. Cl.
| | |
|---|---|
| *H01S 3/098* | (2006.01) |
| *H01S 3/10* | (2006.01) |
| *H01S 5/40* | (2006.01) |
| *H04B 10/572* | (2013.01) |
| *H01S 5/00* | (2006.01) |
| *H01S 5/022* | (2006.01) |
| *H01S 5/024* | (2006.01) |
| *H01S 5/06* | (2006.01) |
| *H01S 5/065* | (2006.01) |

(52) U.S. Cl.
CPC .............. *H01S 5/0078* (2013.01); *H01S 5/005* (2013.01); *H01S 5/0064* (2013.01); *H01S 5/02208* (2013.01); *H01S 5/02284* (2013.01); *H01S 5/02415* (2013.01); *H01S 5/0612* (2013.01); *H01S 5/0653* (2013.01); *H01S 5/4006* (2013.01); *H04B 10/572* (2013.01)

(58) Field of Classification Search
CPC ............ H01S 3/08018; H01S 3/08022; H01S 3/08027; H01S 3/08036; H01S 3/1106; H01S 5/065; H01S 5/0651; H01S 5/0654; H01S 5/141; H01S 5/40; H01S 5/0078; H01S 5/4006
USPC ................................................ 372/18, 19, 20
See application file for complete search history.

(56) References Cited

U.S. PATENT DOCUMENTS

| | | | |
|---|---|---|---|
| 4,101,845 | A | 7/1978 | Russer |
| 4,734,380 | A | 3/1988 | Tsang |
| 5,889,800 | A | 3/1999 | Kafka et al. |
| 6,661,815 | B1 | 12/2003 | Kozlovsky et al. |

(Continued)

OTHER PUBLICATIONS

Kaminow et al.—A Tunable Vernier Fiber Fabry-Perot Filter for FDM Demultiplexing and Detection; IEEE Photonics Technology Letters, vol. 1, No. 1, Jan. 1989.
S. L. Woodward et al.—A Spectrally Sliced PON Employing Fabry-Perot Lasers; IEEE Photonics Technology Letters vol. 10, No. 9; Sep. 1998.

(Continued)

*Primary Examiner* — Armando Rodriguez
(74) *Attorney, Agent, or Firm* — Perry + Currier, Inc.

(57) ABSTRACT

A discretely tunable laser device is provided. The discretely tunable laser device comprises: a laser comprising a plurality of discrete output modes; an optical filter for receiving output from the laser but otherwise optically isolated from the laser, the optical filter comprising a plurality of transmission peaks, each separated by a transmission spacing different from a spacing of the plurality of discrete output modes such that only one discrete output mode can predominantly align with one transmission peak when the plurality of discrete output modes are tuned; and, a control apparatus for tuning the discrete output modes of the laser to align a given output mode of the plurality of discrete output modes with a given transmission peak of the plurality of transmission peaks, such that the given output mode comprises a dominant output of the optical filter.

20 Claims, 28 Drawing Sheets

(56) References Cited

U.S. PATENT DOCUMENTS

| | | |
|---|---|---|
| 7,515,626 B2 | 4/2009 | Lee et al. |
| 7,593,647 B2 | 9/2009 | Lee et al. |
| 2007/0071040 A1* | 3/2007 | Flanders et al. ............ 372/20 |
| 2007/0133647 A1* | 6/2007 | Daiber ........................ 372/99 |
| 2008/0285601 A1* | 11/2008 | Sherrer et al. .............. 372/19 |
| 2010/0111533 A1 | 5/2010 | Beckett et al. |

OTHER PUBLICATIONS

Zhaowen Xu et al.—10Gb/s WDM-PON Upstream Transmission Using Injection-locked Fabry-Perot Laser Diodes; 2006 Optical Society of America.

Sang-Mook Lee et al.—Dense WDM-PON Based on Wavelength-Locked Fabry-Perot Laser Diodes; IEEE Photonics Technology Letters, vol. 17, No. 7, Jul. 2005.

* cited by examiner

DISCRETELY TUNABLE LASER DEVICE

FIELD

The specification relates generally to telecommunication devices, and specifically to a discretely tunable laser device.

BACKGROUND

Tunable lasers are necessary components in optical communication systems. However, existing tunable lasers are generally based on expensive technologies such as external cavity lasers and/or multiple section lasers. For example, external cavity semiconductor lasers use a wide-band semiconductor gain medium and external wavelength-selective optics to confine the round-trip laser gain to a specific wavelength. Tuning of the wavelength-selective optics is performed by mechanical apparatus (e.g. angle tuning of a diffraction grating) or electro-mechanical mechanical apparatus (e.g. Fabry-Perot cavity mounted on a piezo-electric crystal), the cost of which is generally quite high. Multiple section lasers use narrow tuning range devices that are selected electrically, such as multiple-section DFB (distributed feedback) or DBR (distributed Bragg reflector) lasers, or separate lasers that are selected using MEMS (microelectromechanical systems) devices, each of which are, again, expensive.

SUMMARY

The present specification provides a discretely tunable laser device comprising: a laser comprising a plurality of discrete output modes; an optical filter for receiving output from the laser but otherwise optically isolated from the laser, the optical filter comprising a plurality of transmission peaks, each separated by a transmission spacing different from a spacing of the plurality of discrete output modes such that only one discrete output mode can predominantly align with one transmission peak when the plurality of discrete output modes are tuned; and, a control apparatus for tuning the discrete output modes of the laser to align a given output mode of the plurality of discrete output modes with a given transmission peak of the plurality of transmission peaks, such that the given output mode comprises a dominant output of the optical filter.

The laser can comprise one or more of a Fabry-Perot Laser and a quantum dot laser.

The optical filter can comprise one or more of a passive filter and an etalon.

The optical filter can comprise a tunable filter. The discretely tunable laser device can further comprise a second control apparatus for tuning the plurality of transmission peaks at the tunable filter to further align the given output mode with the given transmission peak.

The discretely tunable laser device can further comprise an optical isolator located between the laser and the optical filter, the optical isolator to prevent optical coupling between the laser and the optical filter.

As input area of the optical filter can be at an off-normal angle to the laser to prevent one or more of reflected light and emitted light from the optical filter reaching the laser. The discretely tunable laser device can further comprise an absorber for absorbing one or more of the reflected light and emitted light. The discretely tunable laser device can further comprise packaging for containing the laser, the optical filter and at least a portion of the control apparatus, the inside of the packaging comprising the absorber.

The discretely tunable laser device can further comprise a lens between the laser and the optical filter, the lens for collimating the light from the laser into the optical filter.

The discretely tunable laser device can further comprise a lens located after an output of the optical filter for focussing emitted light from the optical filter.

The discretely tunable laser device can further comprise apparatus for coupling the discretely tunable laser device to an optical fiber, wherein light emitted from the optical filter is focussed onto an area where an end of the optical fiber is to be located to be received as input by the optical fiber.

The control apparatus can comprise one or more of a thermo-electric cooler and a current control apparatus.

The control apparatus can comprise a thermo-electric cooler and a processor, the processor enabled to control the thermo-electric cooler to a setting associated with the given output mode aligning with the given transmission peak.

The discretely tunable laser device, wherein the discretely tunable laser can at least one of: further comprise a power monitor for monitoring light emitted from the optical filter in a feedback loop with the control apparatus; and, be enabled to be coupled to an external power monitor, the control apparatus can be enabled to: tune the discrete output modes of the laser to align the given output mode with the given transmission peak; receive data from one or more of the power monitor and the external power monitor; and, further tune the discrete output modes of the laser to improve alignment of the given output mode with the given transmission peak by determining a local maximum of one or more of the power monitor and the external power monitor. The power monitor can comprise a tap coupler.

The spacing of the plurality of discrete output modes can be determined by one of: $G*(N-1)/N$; $G*(N+1)/N$; an integer multiple of one of $G*(N-1)$ and $G*(N+1)/N$; and, a subset of modes defined by one of $G*(N-1)/N$ and $G(*N+1)/N$, wherein G is the transmission spacing of the plurality of transmission peaks of the optical filter and N is the number of the plurality of transmission peaks of the optical filter in an output band of the discretely tunable laser device.

Each of the plurality of transmission peaks corresponds to modes in one or more of a communications band and a medical device band.

The discretely tunable laser device can further comprise a wavelength monitor for monitoring a wavelength of light emitted from the optical filter.

The discretely tunable laser device can further comprise an optical amplifier for optically amplifying light emitted from the optical filter.

BRIEF DESCRIPTIONS OF THE DRAWINGS

For a better understanding of the various implementations described herein and to show more clearly how they may be carried into effect, reference will now be made, by way of example only, to the accompanying drawings in which:

FIG. 5 further depicts a given output mode in alignment with a given transmission peak.

DETAILED DESCRIPTION

Figure 1:
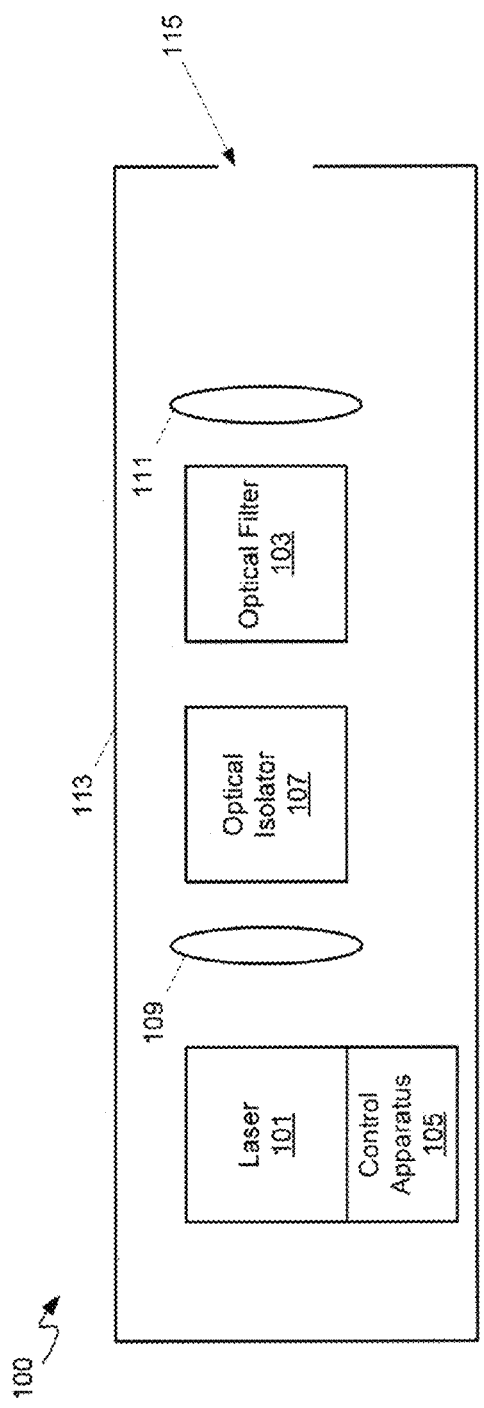
FIG. 1 depicts a schematic diagram of a discretely tunable laser device, according to non-limiting implementations.

FIG. 1 depicts a laser device 100, according to non-limiting implementations. Laser device 100 will be interchangeably referred to hereafter as device 100. Device 100 generally comprises: a laser 101 comprising a plurality of discrete output modes; an optical filter 103 for receiving output from laser 101 but otherwise optically isolated from laser 101, optical filter 103 comprising a plurality of transmission peaks, each separated by a transmission spacing different from a spacing of the plurality of discrete output modes such that only one discrete output mode can predominantly align with one transmission peak when the plurality of discrete output modes are tuned; and, a control apparatus 105 for tuning the discrete output modes of laser 101 to align a given output mode of the plurality of discrete output modes with a given transmission peak of the plurality of transmission peaks, such that the given output mode comprises a dominant output of the optical filter. It is appreciated that the dominant given output mode can be output with side modes that are not dominant, for example, see FIGS. 6 and 8 described below.

It is further appreciated that FIG. 1 depicts a specific non-limiting example of device 100. In particular, device 100 depicted in FIG. 1 comprises an optical isolator 107, interchangeably referred to hereafter as isolator 107, for optically isolating optical filter 103 from laser 101 to prevent optical coupling between laser 101 and optical filter 103. Isolator 107 can comprise any suitable optical isolator, optical, diode or the like.

Device 100 further comprises a lens 109 between laser 101 and optical filter 103, lens 109 for collimating light from laser 101 into optical filter 103. Device 100 further comprises a lens 111 located after an output of optical filter 103 for focussing emitted light from optical filter 103, for example onto an area where in input of an optical fiber is to be located.

Device 100 further comprises packaging 113 for containing components of device 100. In general, device 100 further comprises further comprises apparatus 115 for coupling device 100 to an optical fiber, as described in further detail below. For example, as depleted, apparatus 115 can comprise an aperture in packaging 113 for receiving an optical fibre. While not depicted, apparatus 115 can further comprise a device for seating an input of an optical fiber at a focal point of lens 111.

It is yet further appreciated that, while not depicted, a source of power is provided for device 100 which can comprise one or more of an on-board power pack and/or a connection to an external source of power.

Figure 2:
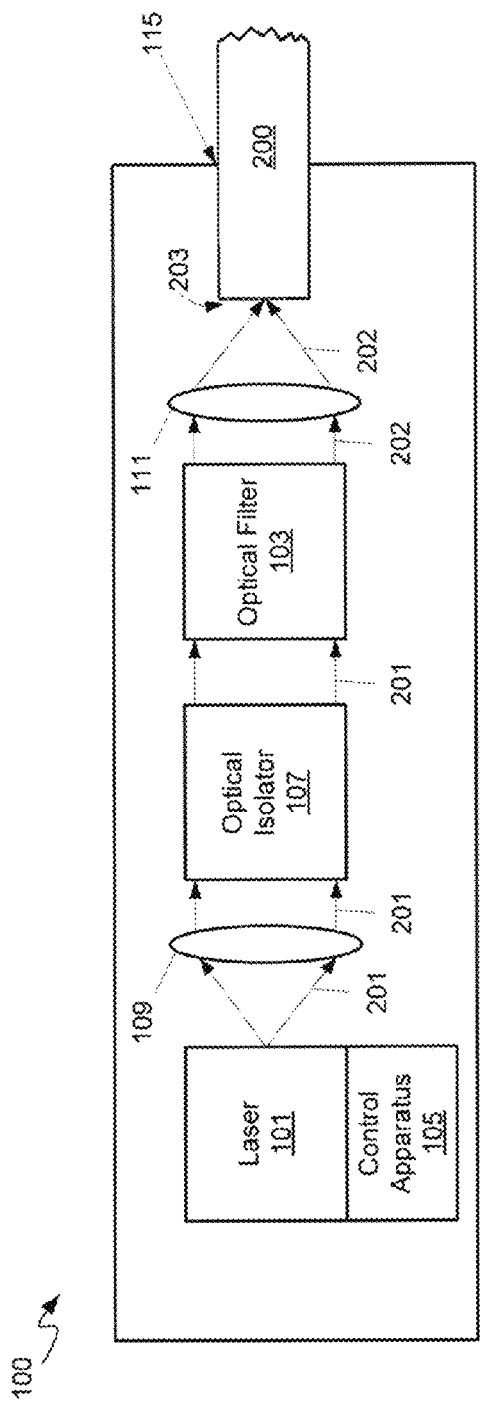
FIG. 2 depicts light paths in the discretely tunable laser device of FIG. 1, the discretely tunable laser device coupled to an optical fiber, according to non-limiting implementations.
Figure 3:
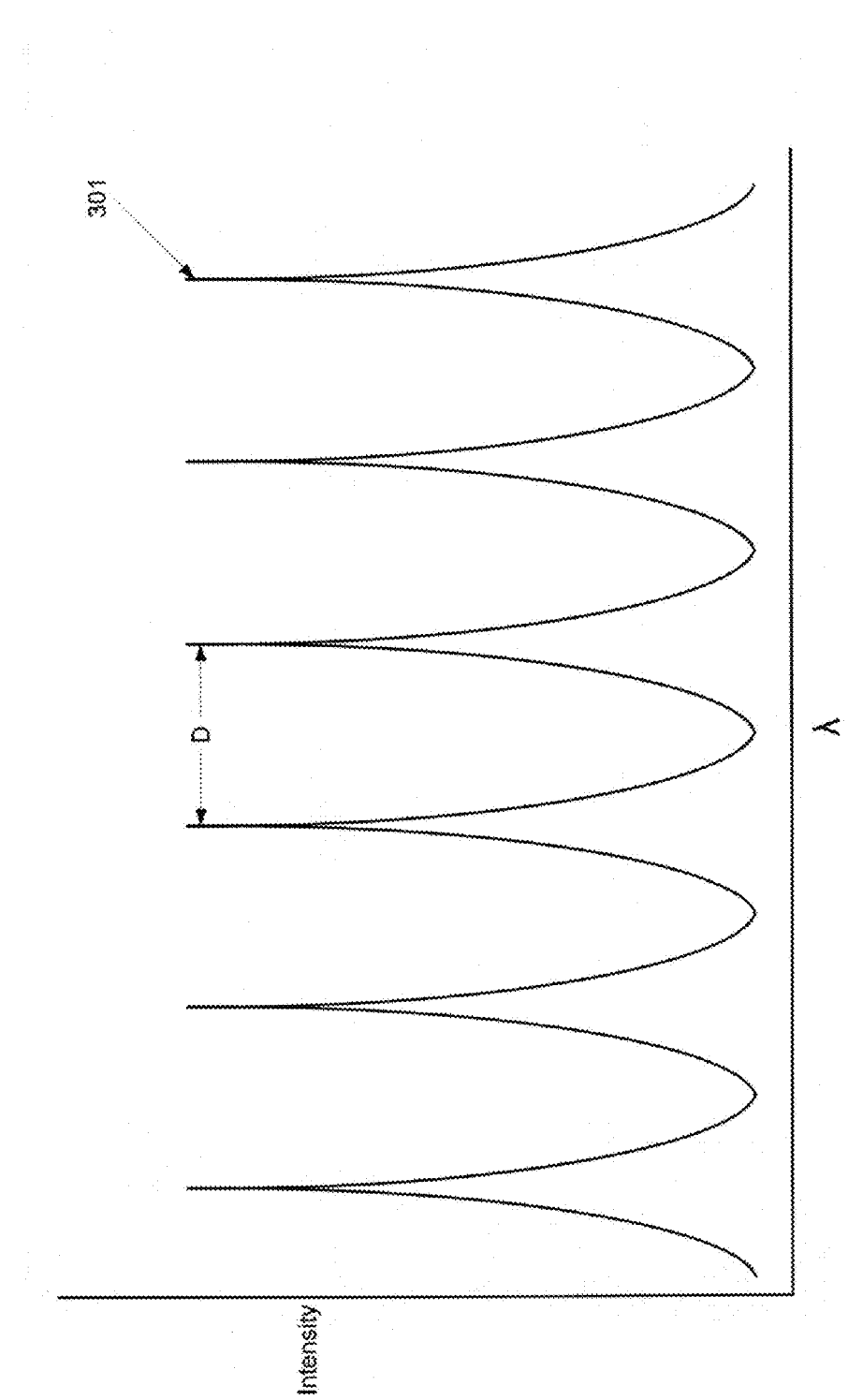
FIG. 3 depicts a graph of a subset of discrete output modes of a laser in the discretely tunable laser device of FIG. 1, according to non-limiting implementations.

Attention is next directed to FIG. 2 which depicts device 100 coupled to an optical fiber 200 and light paths in device 100. In other words, optical fiber 200 has been inserted into apparatus 115 and hence is coupled to device 100. FIG. 2 is substantially similar to FIG. 1 with like elements having like numbers. In general, laser 101 emits light 201 which is collimated by lens 109 before passing through isolator 107. It is appreciated that isolator 107 can alternatively be located between laser 101 and lens 109. In any event, collimated light 201 then passes through optical filter 103 where a one of the plurality of discrete modes is selected, as described in further detail below. Collimated filtered light 202 exits optical filter 103 where light 202 is then focussed by lens 111 onto an area where an input end 203 of an optical fiber 200 is located (as depicted in FIG. 3), light 202 received as input by optical fiber 200. Indeed, it is appreciated that input 203 is seated at a focal point of lens 111. Light 202 can further be modulated, as described below, such that light 202 can carry information to an endpoint (not depicted) of optical fiber 200. Such modulation can occur within device 100 or external to device 100.

In general, laser 101 comprises any suitable laser which comprises a plurality of discrete output modes including, but not limited to, a Fabry-Perot Laser. A non-limiting example of the plurality of discrete output modes are depicted in FIG. 3, which generally depicts a graph of discrete output modes 301, each output mode 301 comprising a peak at a respective wavelength, as represented by "λ" FIG. 3. Furthermore, it is appreciated that FIG. 3 shows only a subset of the discrete output modes 301. In other words, while only six discrete output modes 301 are depicted at FIG. 3, any suitable number of discrete output modes 301 are within the scope of present implementations, as will be described in further detail below.

While absolute values of wavelengths of discrete output modes 301 and absolute intensities of discrete output modes 301 are not shown in FIG. 3, it is appreciated that the range of wavelengths and the intensities can depend on a type and tuning of laser 101, and can further be selected based on pre-determined requirements for device 100. For example, in specific non-limiting implementations, device 100 can be used for generating light with wavelengths in the telecommunications C-Band and hence wavelengths of discrete output modes 301 can be in a range of about 1530 nm to about 1570 nm. However, in other implementations, device 100 can be used for generating light with wavelengths in the telecommunications L-Band or the S-band, and hence wavelengths of discrete output modes 301 can be in a range of about 1570 nm to about 1612 nm or about 1491 nm to about 1530 nm, respectively. However, in yet further implementations, wavelengths of discrete output modes 301 can be in any suitable range corresponding to any suitable communication band.

It yet further appreciated that each output mode 301 is separated by a spacing D. A relationship between spacing D and transmission spacing of transmission peaks of optical filter 103 are described below with reference to FIG. 5.

In any event, laser 101 can comprise any suitable laser having output similar to that depicted in FIG. 3. In general Fabry-Perot lasers have such an output, however Fabry-Perot lasers can be fabricated using any suitable laser technologies as the light source, including, but not limited to, bulk lasers, quantum well lasers, quantum wire lasers and quantum dot lasers. In general, Fabry Perot lasers made with quantum dot material provide the lowest relative intensity noise (RIN) in this list.

It is hence appreciated that the choice of laser technology can hence depend on the specifications of the system over which data is to be transmitted. For long-reach telecommunication systems, where data is to be transmitted at high data rates and hence low RIN, for example greater than or equal to about 10 Gb/s, laser 101 can comprise a quantum dot laser; in other implementations, a laser technology with a higher RIN can be used, depending on the noise tolerance levels of the implementation.

In any event, in particular non-limiting implementations, laser 101 comprises a Fabry-Perot laser diode (FPLD), and specifically a Fabry-Perot quantum dot (FPQD) laser diode, which emits light at a given wavelength at a given temperature, and the Fabry-Perot structure produces the plurality of discrete output modes. It is yet further appreciated that the given wavelength can shift with temperature.

Figure 4:
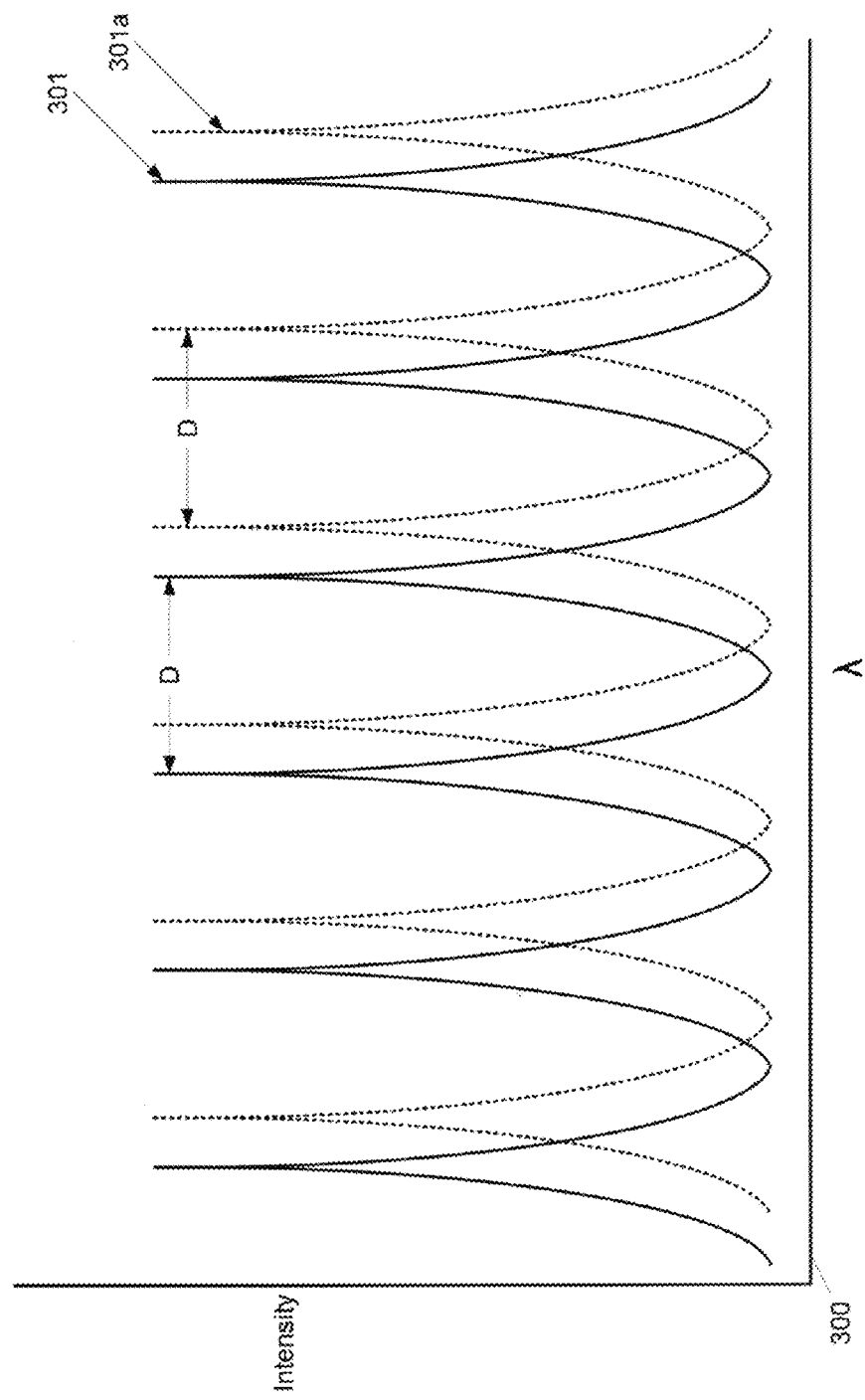
FIG. 4 depicts a graph of a subset of discrete output modes of a laser in the discretely tunable laser device of FIG. 1, and shifted discrete output modes, according to non-limiting implementations.

Hence, control apparatus 105 comprises a thermo-electric cooler which controls the temperature of laser 101. As temperature of laser 101 changes, a position of discrete output modes 301 shifts, as depicted in FIG. 4, which is substantially similar to FIG. 3, with like elements having like numbers, however FIG. 4 further depicts a shifted plurality of discrete output modes 301a. In general the shifted plurality of discrete output modes 301a comprises the plurality of discrete output modes 301, but shifted in wavelength due to a temperature change caused by control apparatus 105, as described in further detail below. Hence, peaks of the shifted plurality of discrete output modes 301a are also separated by distance D. In other words, the plurality of discrete output modes 301 are shifted as a group; all peaks are shifted in a similar manner for a given temperature change.

It is further appreciated that in other implementations, control apparatus 105 can comprise a current control apparatus enabled to control current to laser 101 as laser current can also shift a position of discrete output modes 301. In yet further implementations control apparatus can be enabled to control a combination of current to laser 101 and temperature of laser 101.

Figure 5:
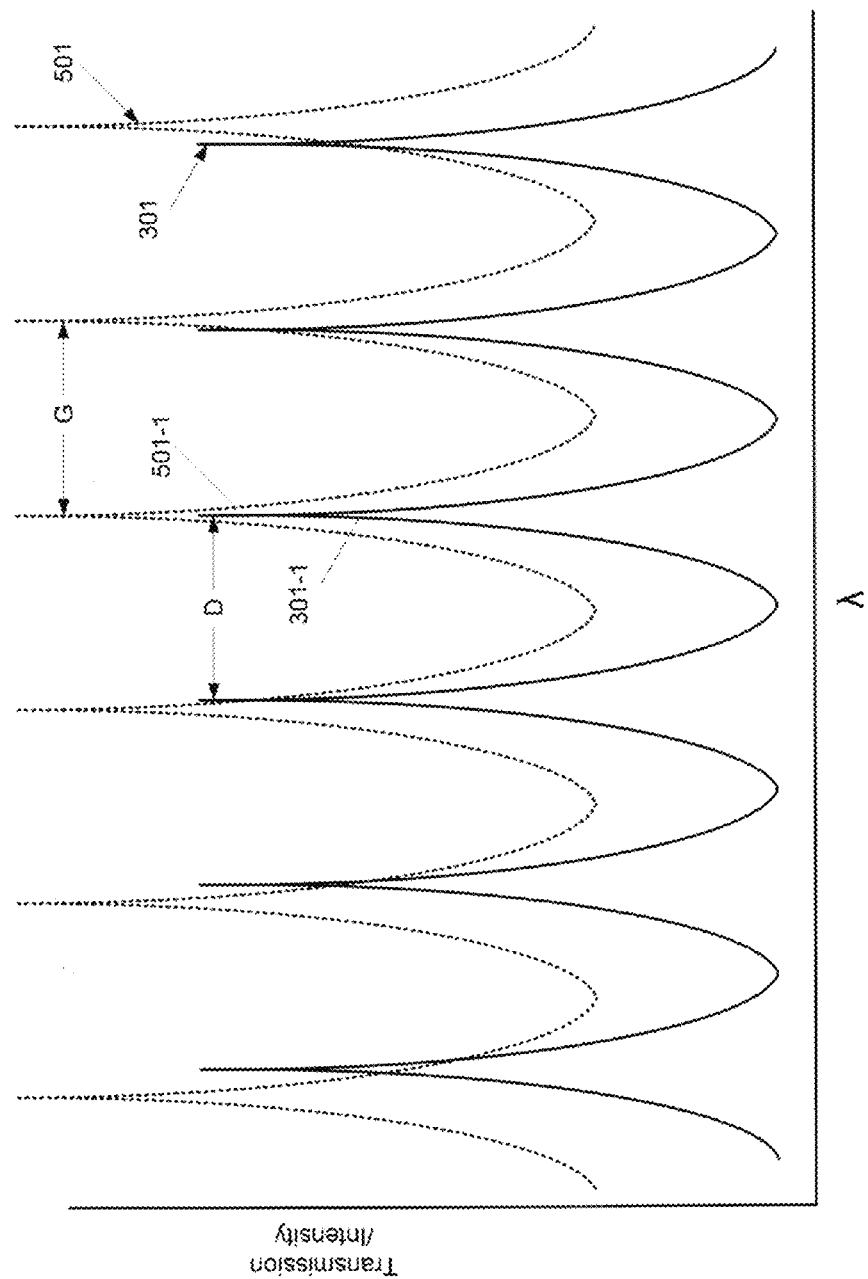
FIG. 5 depicts a graph of a subset of discrete output modes of a laser in the discretely tunable laser device of FIG. 1, and a subset of transmission peaks of an optical filter of the in the discretely tunable laser device of FIG. 1, according to non-limiting implementations.

In specific non-limiting implementations, optical filter 103 comprises a passive filter. For example, in these implementations, optical filter 103 comprises an etalon (e.g. a transparent plate with two opposing reflecting surfaces). In general, optical fitter 103 comprises a plurality of transmission peaks 501, as depicted in FIG. 5, which further depicts the plurality of discrete output modes 301. In general FIG. 5 is similar to FIG. 3 with like elements having like numbers. Furthermore, it is appreciated that FIG. 5 shows only a subset of transmission peaks 501. In other words, while only six transmission peaks 501 are depicted in FIG. 3. It is appreciated that any suitable number of transmission peaks 501 are within the scope of present implementations.

While absolute values of wavelengths of discrete transmission peaks 501 and absolute values of transmission peaks 501 are not shown in FIG. 5. It is appreciated that the range of wavelengths and the transmission values can depend on a configuration of optical filter 103, and can further be selected based on pre-determined requirements for device 100. For example, as described above, in specific non-limiting implementations, device 100 can be used for generating light with wavelengths in the telecommunications C-Band and hence wavelengths of transmission peaks 501 can each correspond to a wavelength in the telecommunications C-band in a range of about 1530 nm to about 1570 nm. However, in other implementations, device 100 can be used for generating light with wavelengths in the telecommunications L-Band or the telecommunications S-band, and hence wavelengths of transmission peaks 501 each correspond to a wavelength in the telecommunications L-band, in a range of about 1570 nm to about 1612 nm or a wavelength in the telecommunications S-band in a range of about 1491 nm to about 1530 nm, respectively. However, in yet further implementations, wavelengths of transmission peaks 501 can correspond to wavelengths in any suitable communication band in any suitable range. It is further appreciated that the number of transmission peaks 501 can correspond to the number of transmission peaks in a given communication band. It is further appreciated that the telecommunications C-band, L-band and S-band can correspond to modes in respective International Telecommunications Union (ITU) grids and the number of modes in each respective band can correspond to the number of respective channels in each band, for example 80, 88 or 96 channels for a 50 GHz spacing and 40 or 44 channels for a 100 GHz spacing.

In general transmission peaks 501 are separated by a transmission spacing G different from a spacing D of the plurality of discrete output modes 301. One or more of transmission spacing G and spacing D is generally selected such that only one discrete output mode 301 can predominantly align with one transmission peak 501 at any given position of discrete output modes 301 when the plurality of discrete output modes 301 are tuned. This situation is depicted in FIG. 5, where only an output mode 301-1 is depicted as aligning with a transmission peak 501-1, whereas the other output modes 301 do not align with other transmission peaks 501.

Hence, one or more of transmission spacing G and spacing D is generally selected to achieve this situation. For example, in specific non-limiting implementations, a relationship between spacing G, D can be determined by one of:

$$D = G*(N-1)/N \qquad \text{Equation 1; and}$$

$$D = G*(N+1)/N \qquad \text{Equation 2,}$$

where N is the number of the plurality of transmission peaks 501 of optical filter 103 in an output band of laser 101. For example, when transmission peaks 501 correspond to wavelengths in a 40 channel 100 GHz ITU grid, N can be about 40 and G can be about 0.8 nm (but can vary over the grid). It is yet further appreciated that the total bandwidth of device 100 is generally optically restricted to G*N, either by one or more of: explicit filtering; and restriction of a gain curves of lasers 101, and the final output bandwidth of device 100 can be restricted by one or more of output bandwidth of laser 101, and a transmission bandwidth of optical filter 103. Such filtering and restrictions are to prevent a vernier repetition of another discrete output mode 301 predominantly aligning with another transmission peak 501 that could create one or more unwanted dominant side modes.

In other implementations, D can be an integer multiple of one of G*(N−1)/N and G*(N+1)/N.

In yet further implementations, D can be determined by a subset of one of G*(N−1)/N and G*(N+1)/N. For example, as both G*(N−1)/N and G*(N+1)/N each define a spacing between discrete output modes, D can also be determined by a subset of the discrete output modes defined by one of G*(N−1)/N and G*(N+1)/N, for example, every second discrete output mode, every third output mode, etc.

Regardless, spacing D is chosen to be a little smaller or a little larger (and/or a corresponding integer multiple of a similar smaller or larger value) than spacing G such that when one discrete output mode 301 is aligned with one transmission peak 501, other discrete output modes 301 are not aligned with other transmission peaks 501. Hence, as control apparatus 105 shifts a position of the plurality of output modes 301, a unique alignment can occur between a given one of output modes 301 and a given one of transmission peaks 501 such that optical filter 103 can predominantly output light at one of wavelengths represented by transmission peaks 501 at any given time. Hence, a dominant discrete output mode is produced.

Furthermore, equations 1 and 2 are not the only relationship between spacing G, D which will provide the desired condition, and other such relationships are within the scope of present implementations. Indeed, in some implementations, spacing D can be determined experimentally and/or by trial and error.

Figure 6:
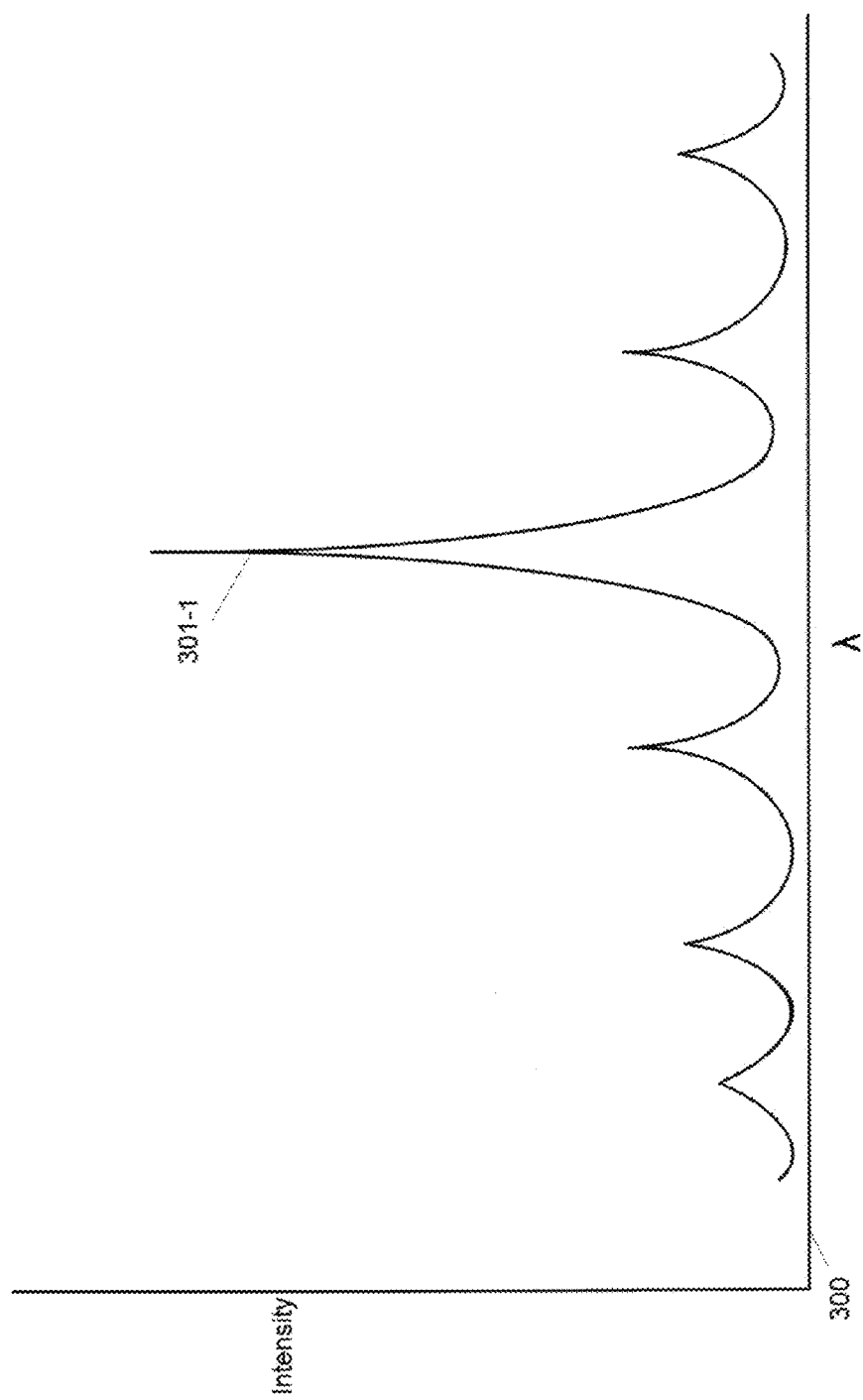
FIG. 6 depicts an output of the discretely tunable laser device of FIG. 1 when a given output mode is in alignment with a given transmission peak as in FIG. 5, according to non-limiting implementations.

In any event, as depicted in FIG. 5, control apparatus 105 tunes discrete output modes 301 of laser 101 to align a given output mode 301-1 with a given transmission peak 501-1. The resulting output is depicted in FIG. 6, which depicts a graph of intensity vs. wavelength of an output of optical filter 103. As appreciated from FIG. 6, as only given output mode 301-1 is aligned with a transmission peak 501 (and specifically given transmission peak 501-1), given output mode 301-1 comprises a dominant output mode of optical filter 103. While FIG. 6 further depicts other output modes that are transmitted, their intensities are much lower than that of output mode 301-1 as they are not aligned with any of transmission peaks 501.

Figure 7:
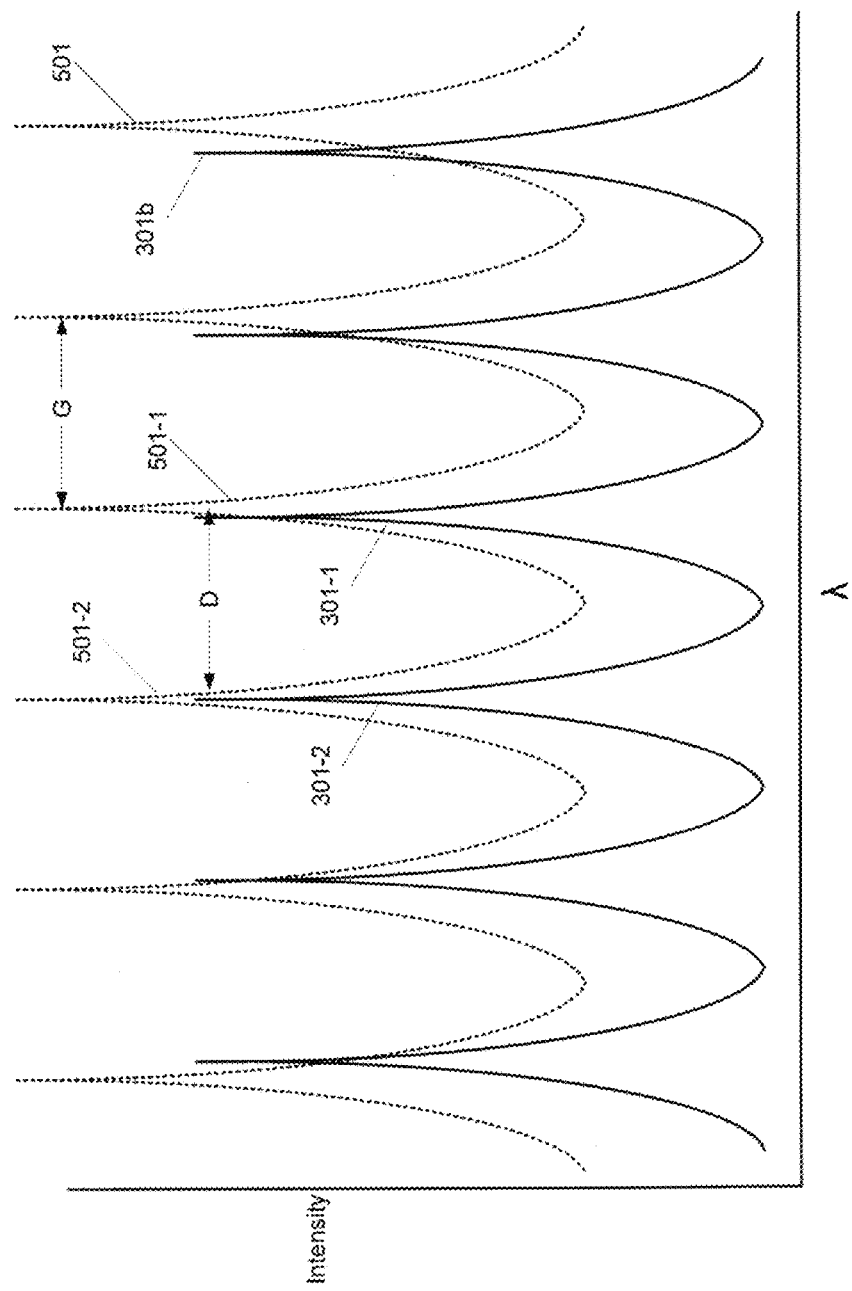
FIG. 7 is similar to FIG. 5, however the subset of discrete output modes has shifted so that another given output mode is in alignment with another given transmission peak, according to non-limiting implementations.

In order to tune device 100 to a different output mode, control apparatus 105 tunes discrete output modes 301 to a new position where a different output mode 301-2 is aligned with another transmission peak 501-2, as depicted in FIG. 7. Specifically, FIG. 7 depicts the shifted plurality of discrete output modes 301b comprising the plurality of discrete output modes shifted to a new position where given output mode 301-2 is aligned with given transmission peak 501-2. In general, FIG. 7 is substantially similar to FIG. 5, with like elements having like numbers, and with the plurality of discrete output modes shifted to the position of shifted plurality of discrete output modes 301b.

Figure 8:
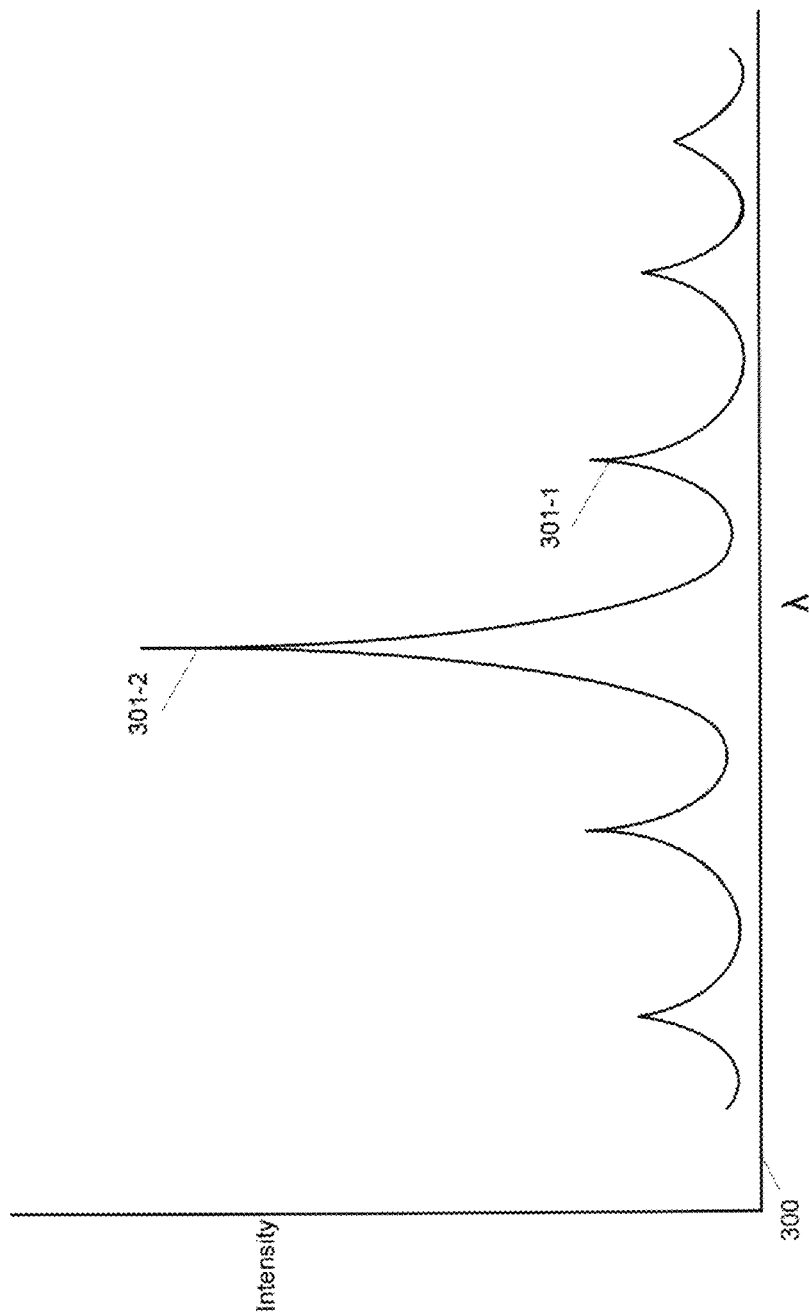
FIG. 8 depicts an output of the discretely tunable laser device of FIG. 1 when another given output mode is in alignment with another given transmission peak as in FIG. 7, according to non-limiting implementations.

The resulting output is depicted in FIG. 8, which is substantially similar to FIG. 6, but with output mode 301-2 comprising the dominant output mode. As appreciated from FIG. 8, as only given output mode 301-2 is aligned with a transmission peak 501 (and specifically given transmission peak 501-2), given output mode 301-2 is the dominant output of optical filter 103. While FIG. 6 further depicts other output modes that are transmitted, their intensities are much lower than that of output mode 301-2. Indeed, an intensity of given output mode 301-1 (which as the dominant output mode in FIG. 6) is appreciated to be substantially lower than given output mode 301-2.

In any event, it is appreciated that optical filter 103 comprises the plurality of transmission peaks 501, each separated by a transmission spacing G different from spacing D of plurality of discrete output modes 301 such that only one discrete output mode 301 can align with one transmission peak 501 when the plurality of discrete output modes are tuned by control apparatus 105.

Figure 9:
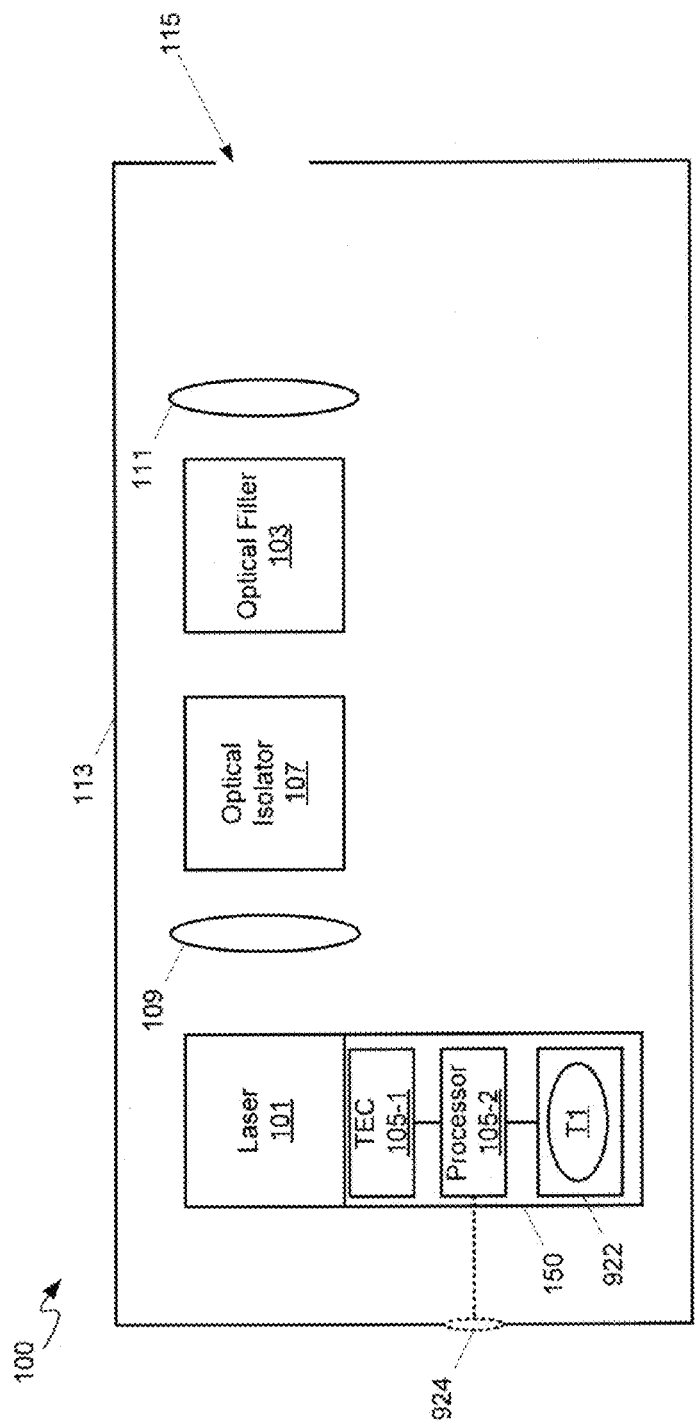
FIG. 9 depicts a schematic diagram of the discretely tunable laser device of FIG. 1 with details of a control apparatus, according to non-limiting implementations.

Attention is next directed to FIG. 9, which depicts details of implementations of control apparatus 105, and is otherwise similar to FIG. 1, with like elements having like numbers. In any event, in these implementations, control apparatus 105 comprises a thermo-electric cooler (TEC) 105-1 and a processor 105-2. TEC 105-1 can comprise any suitable thermo-electric cooler, including but not limited to, a Peltier cooler, heater, thermoelectric heat pump and the like. It is further appreciated that TEC 105-1 can comprise a temperature sensor, including, but not limited to a thermistor, for measuring the temperature of TEC 105-1. It is hence further appreciated that TEC 105-1 can be controlled to a given temperature in a feedback loop with the temperature sensor. Processor 105-2 can comprises any suitable processor, including but not limited to one or more central processing units (CPUs). Further, processor 105-2 can comprise an output for controlling TEC 105-1, for example a current output for driving TEC 105-1.

In any event, processor 105-2 is generally enabled to control TEC 105-1 to a setting associated with a given output mode 301 aligning with a given transmission peak 501. For example, in depicted implementations, control apparatus 105 further comprises a memory 922 accessible by processor 105-2, memory 922 storing a table T1 comprising a list of settings for TEC 105-1 and associated given output modes 301. In some implementations, processor 105-1 comprises memory 922, for example as on-board random access memory and or on-board read-only memory. In other implementations, memory 922 is a separate component from processor 105-2 and can include, but is not limited to any suitable combination of volatile storage, non-volatile storage, flash memory and the like.

Furthermore, processor 105-2 can be enabled to determine a given output mode 301 to which laser 101 is to be tuned and control TEC 105-1 to a corresponding setting by determining the corresponding setting from table T1. For example, processor 105-2 can receive an indication of a given output mode 301 via an optional input 924 interconnected with processor 105-2, input 924 connected to an external computing device (not depicted). Input 924 can comprise any suitable wired and/or wireless input for receiving input from an external computing device, including, but not limited to a connector for receiving a wired connection (e.g. a cable connection) and a wireless radio (including, but not limited to one or more of a WiFi radio and a Bluetooth™ radio).

Table T1 can comprise a list of wavelengths corresponding to respective given output modes 301 and associated settings of TEC 105-1. In a specific non-limiting example, table T1 can comprise wavelengths of the ITU C-Band 100 GHz grid with associated TEC settings:

TABLE T1

| Wavelength (nm) | TEC Setting |
|---|---|
| 1569.59 | TEC Setting 1 |
| 1569.77 | TEC Setting 2 |
| 1567.95 | TEC Setting 3 |
| ... | ... |
| 1530.33 | TEC Setting 50 |

In these specific non-limiting example, table T1 comprises two columns, and rows of a first column ("Wavelength (nm)") corresponding to desired wavelengths to be output by device 100, the number of rows corresponding to the number of output modes; the corresponding rows of a second column ("TEC Setting") comprising the corresponding current setting to which TEC 105-1 is to be controlled such that the corresponding wavelength is output by optical filter 103. It is appreciated that the format of table T1 is not limiting: in other words, table T1 can be in any suitable format. Furthermore, table T1 need not specifically include the wavelengths. For example, rather than a wavelength, processor 105-2 could receive as input a mode number "n" of laser 101 and control TEC 105-1 to the "$n^{th}$" mode, or the "$n^{th}$" TEC setting in table T1.

It is yet further appreciated that the TEC settings stored in table T1 are pre-determined and pre-populated at T1. For example, a temperature and/or a thermistor resistance to which TEC 105-1 is to be controlled for device 100 to output light at 1569.59 nm can be experimentally determined and stored at table T1. Indeed, a temperature and/or a thermistor resistance, to which TEC 105-1 is to be controlled for device 100 to output light at any of the wavelengths in a given communication band, can be experimentally determined and stored at table T1.

Furthermore, while temperature and/or thermistor resistance settings are provided in the example table T1, it is appreciated that table T1 can be populated with any settings suitable for controlling TEC 105-1 including, but not limited to, voltage settings, power settings and the like.

In some implementations, processor 105-2 can be pre-programmed to control laser 101 to a specific given output mode 301; in these implementations, table T1 can be optional and processor 105-2 is pre-programmed with a specific setting for controlling TEC 105-1 associated with the specific output mode 301.

It is yet further appreciated that position of discrete output modes 301 are also a function of bias current and/or drive current of laser 101 bias current; hence, Table 1 could also include nominal positions of discrete output modes 301 at different bias current and/or drive current conditions at one or more given temperatures.

Figure 10:
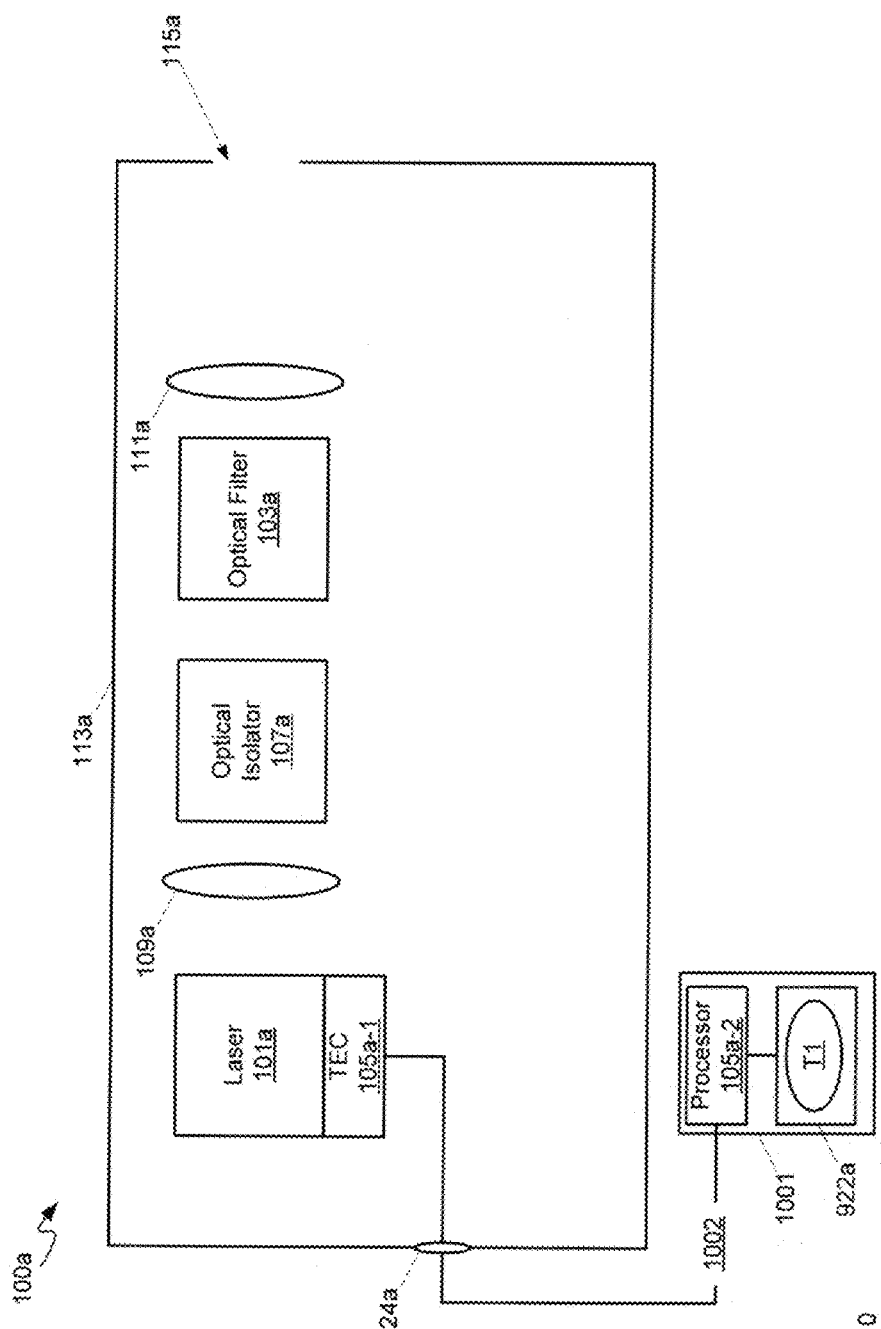
FIG. 10 depicts a schematic diagram of an alternative discretely tunable laser device with a thermo-electric cooler controlled by an external computing device, according to non-limiting implementations.

Attention is next directed to FIG. 10 which depicts an alternate implementation of a discretely tunable laser device 100a, interchangeably referred to hereafter as device 100a. Device 100a is substantially similar to device 100 with like elements having like numbers but with an "a" appended thereto. Device 100a hence comprises a laser 101a, an optical filter 103a, an optical isolator 107a, lenses 109a, 111a, packaging 113a and an apparatus 115a for receiving an optical fiber. However, device 100a comprises a control apparatus in the form of TEC 105a-1, similar to TEC 105-1, interconnected with an input 924a, similar to input 924. Input 924a is enabled for communication with an external computing device 1001 which comprises a processor 105a-2, similar to processor 105-2 and a memory 922a, similar to memory 922, storing table T1. Computing device 1001 is in communication with TEC 105a-1 via a link 1002 and input 924a. Link 1002 comprises any suitable wired and/or wireless link for enabling communication between computing device 1001 and device 100c. In other words, settings for TEC 105-1 are stored external to device 100 and control signals are provided via link 1002. Otherwise device 100c functions similar to device 100.

Figure 11:
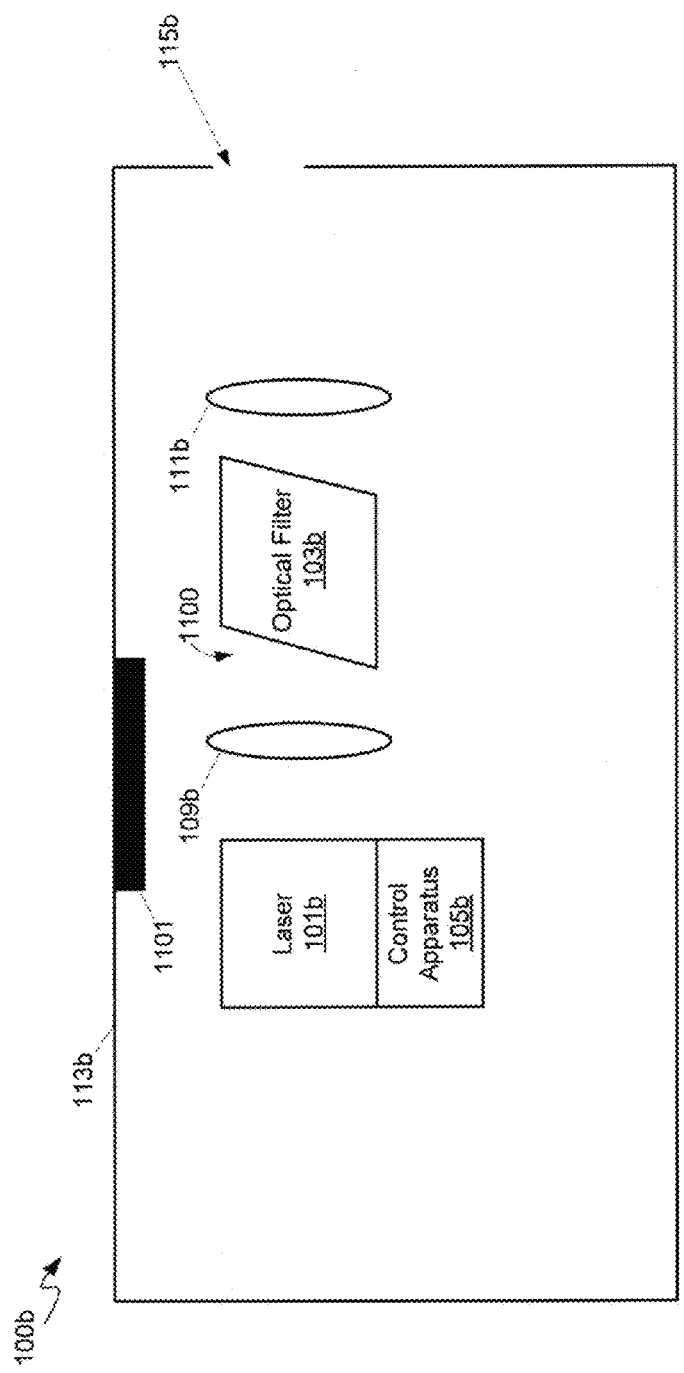
FIG. 11 depicts a schematic diagram of an alternative discretely tunable laser device with an absorber to absorb light from an optical filter having an off-normal input to optically isolate the optical filter from a laser, according to non-limiting implementations.

Attention is next directed to FIG. 11 which depicts an alternate implementation of a discretely tunable laser device 100b, interchangeably referred to hereafter as device 100b. Device 100b is substantially similar to device 100 with like elements having like numbers but with a "b" appended thereto. Device 100b hence comprises a laser 101b an optical filter 103*b*, lenses 109*b*, 111*b*, packaging 113*b* and an apparatus 115*b* for receiving an optical fiber. However, device 100*b* does not comprise an optical isolator similar to optical isolator 107. Rather, optical filter 103*b* comprises an input area 1100 that is at an off-normal angle to laser 101*b* to prevent one or more of reflected light and emitted light from optical filter 103*b* reaching laser 101*b*. In other words, optical filter 103*b* is optically isolated from laser 101*b* by virtue of the angle of input area 1100. To further prevent light from optical filter 103*b* from reaching laser 101*b*, for example from reflections from packaging 113*b*, device 100*b* further comprises an absorber 1101 for absorbing one or more of the reflected light and emitted light from optical filter 103. In some implementations packaging 113*b* can comprise absorber 1101; for example, in some of these implementations absorber 1101 can be formed by coloring an interior of packaging black.

Figure 12:
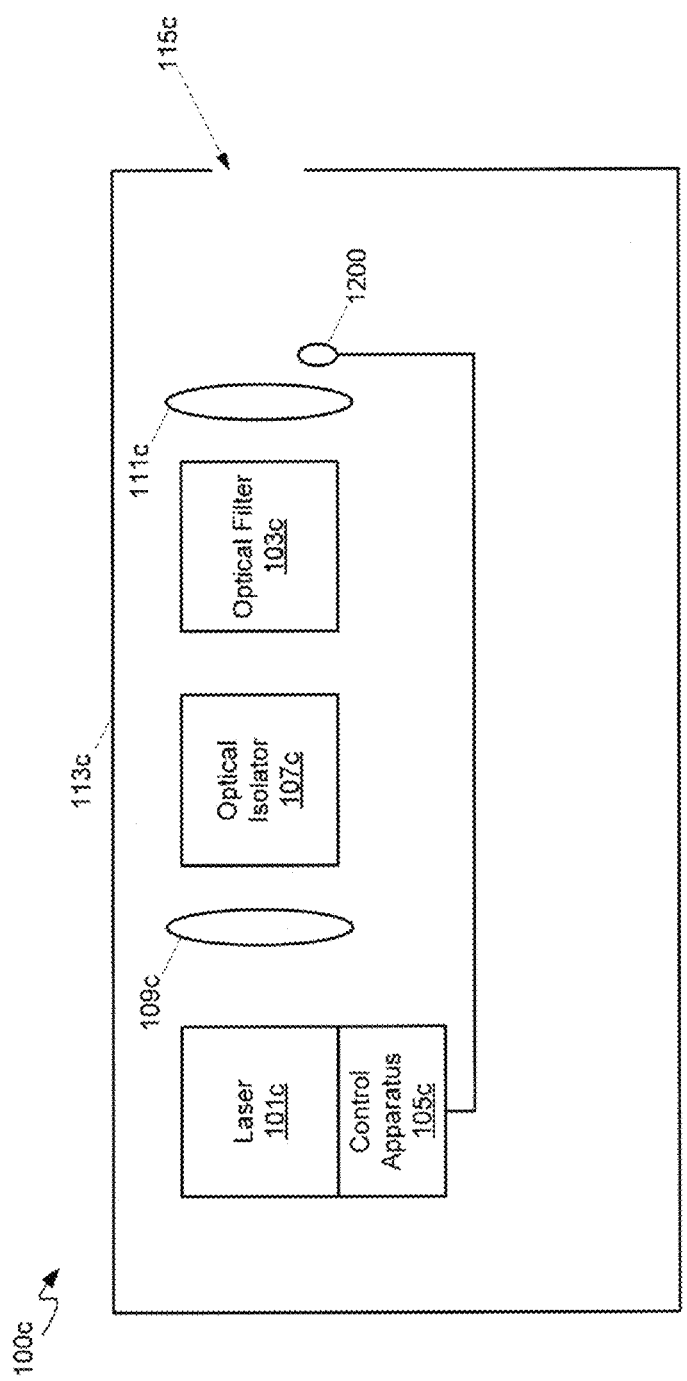
FIG. 12 depicts a schematic diagram of an alternative discretely tunable laser device with a power monitor in a feedback loop with a control apparatus, according to non-limiting implementations.

Attention is next directed to FIG. 12 which depicts an alternate implementation of a discretely tunable laser device 100*c*, interchangeably referred to hereafter as device 100*c*. Device 100*c* is substantially similar to device 100 with like elements having like numbers but with a "c" appended thereto. Device 100*c* hence comprises a laser 101*c*, an optical filter 103*c*, a control apparatus 105*c*, an optical isolator 107*c*, lenses 109*c*, 111*c*, packaging 113*c* and an apparatus 115*c* for receiving an optical fiber. However, device 100*c* further comprises a power monitor 1200 for monitoring light emitted from optical filter 103*c* in a feedback loop with control apparatus 105*c*. In other words, control apparatus 105*c* is interconnected with power monitor 1200 and is generally enabled to receive data from power monitor 1200. The data received from power monitor 1200 can comprise, for example, a signal, the strength of which is indicative of power detected at power monitor 1200.

Power monitor 1200 can comprise any suitable power monitor, including, but not limited to, a tap coupler with a photo-detector. Indeed, while power monitor 1200 is depicted as a device located after lens 111*c*, in other implementations power monitor 1200 can be located in between optical filter 103*c* and lens 111*c*. In yet further implementations, for example implementations where power monitor 1200 comprises a tap coupler, device 100*c* can further comprise optical fiber guides for sampling light emitted from optical filter 103*c*; in these implementations, power monitor 1200 can be located at any suitable location in device 100*c* with the optical fiber guides guiding a sample of light emitted from optical filter 103*c* to power monitor 1200.

In yet further implementations, power monitor 1200 is located external to device 100, and device 100 is further enabled to couple to power monitor 1200. For example, power monitor 1200 can comprise a tap coupler external to device 100 and device 100 can be enabled to couple to the tap coupler.

In any event, in these implementations, control apparatus 105*c* is enabled to: tune the discrete output modes of laser 101*c* to align a given output mode with a given transmission peak as described above, and in response receive data from power monitor 1300 indicative of power of light emitted from optical filter 103*c*. However, in the event that some drift has occurred in laser 101*c* and a setting for controlling laser 101*c* no longer results in good alignment between the given output mode and the given transmission peak, control apparatus 105*c* is further enabled to further tune the discrete output modes of laser 101*c* to improve alignment of the given output mode with the given transmission peak by determining a local maximum of the power monitor. For example, when control apparatus comprise a thermo-electric cooler, current to the thermo-electric cooler is initially set to a value associated with a given output mode being transmitted at optical filter 103*c*, as described above. Current of the thermo-electric cooler is then varied to within plus and minus about 10% for any other suitable value). In response, the signal from power monitor 1200 will change as alignment between the given output mode and the given transmission peak changes (i.e. the signal will increase as alignment improve and decrease as alignment deteriorates), as depicted in FIG. 13.

Figure 13:
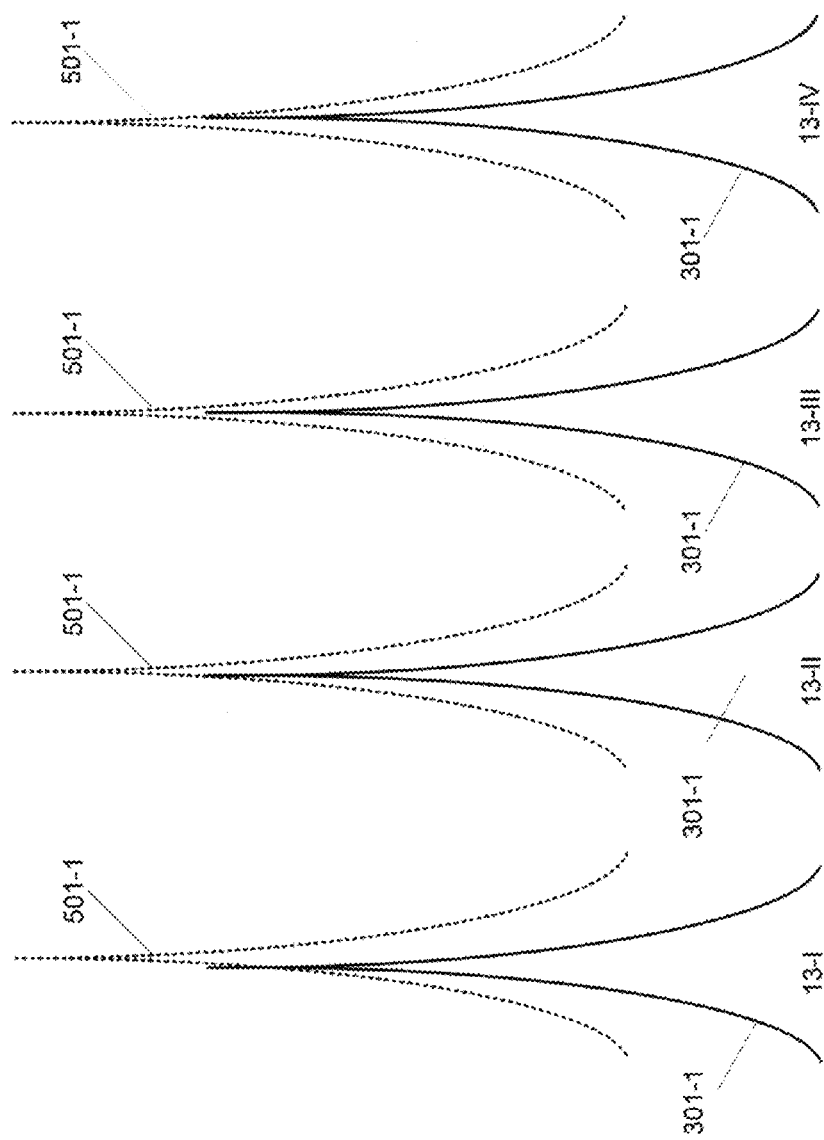
FIG. 13 depicts alignment of a given output mode of a laser of the discretely tunable laser device of FIG. 12 with a given transmission peak of an optical filter at various control settings, according to non-limiting implementations.
Figure 14:
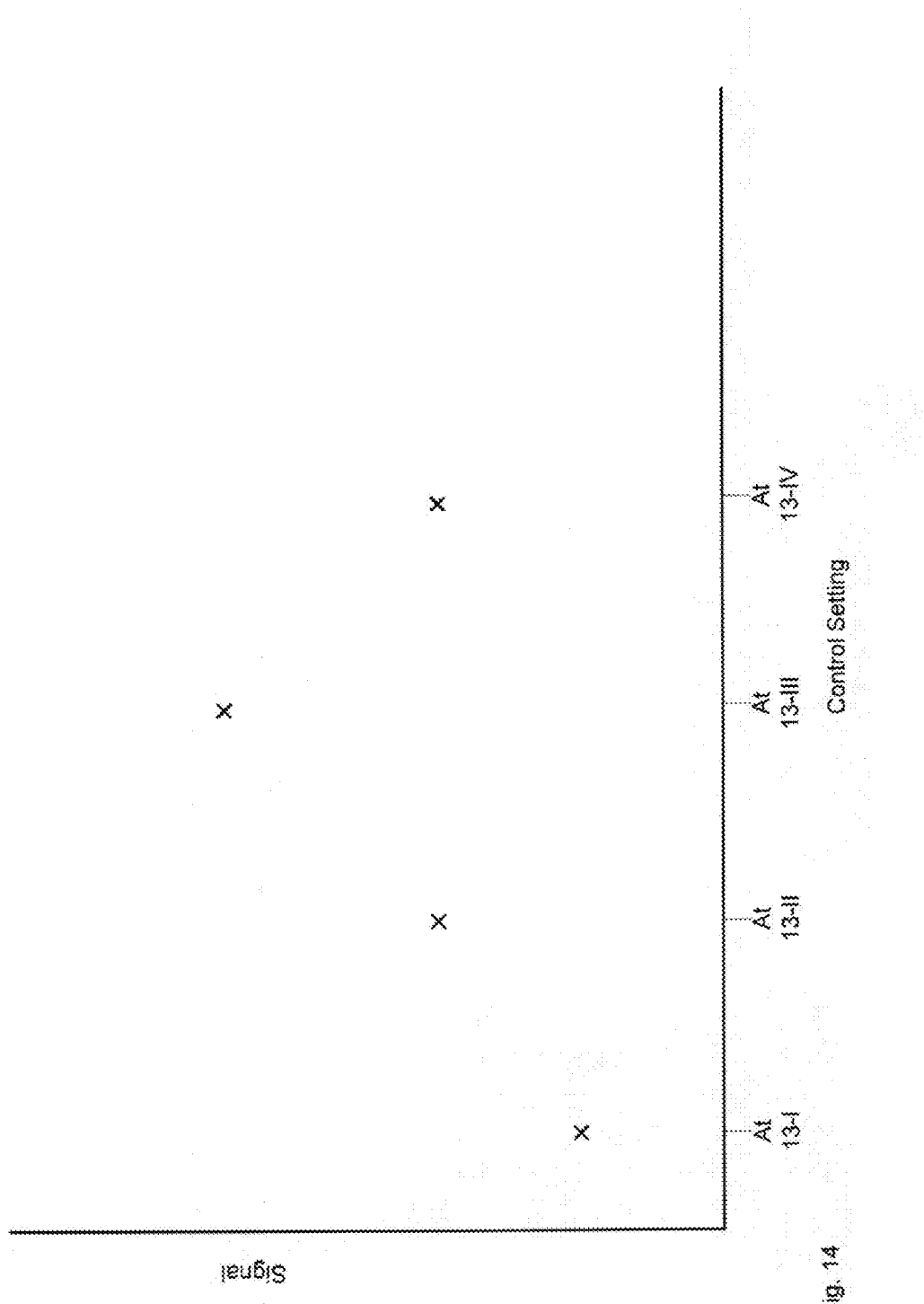
FIG. 14 depicts a signal of the power monitor of the discretely tunable laser device of FIG. 12 as control settings of the control apparatus are varied, according to non-limiting implementations.

Specifically FIG. 13 depicts four different positions 13-I, 13-II, 13-III, 13-IV of output mode 301-1 relative to a fixed position of transmission peak 501-1, four different positions 13-I, 13-II, 13-III, 13-IV resulting from a change in current to the thermo-electric cooler. At an initial position 13-I, output mode 301-1 is appreciated to be not well aligned with transmission peak 501-1; at position 13-II, output mode 301-1 is appreciated to be better aligned with transmission peak 501-1, and hence a signal from power monitor 1200 will increase relative to position 13-I; at position 13-II, output node 301-1 is appreciated to be aligned with transmission peak 501-1, and hence a signal from power monitor 1200 will increase relative to position 13-II; finally, at position 13-IV, output mode 301-1 is appreciated to be poorly aligned with transmission peak 501-1 relative to position 13-III, and hence a signal from power monitor 1200 will decrease relative to position 13-III. FIG. 14 depicts a change in signal from power monitor 1200 as plotted against the corresponding control setting for the thermo-electric cooler associated with positions 13-I, 13-II, 13-III, 13-IV. It is appreciated that the maximum occurs at the control setting associated with position 13-III. It is further appreciated that if the control setting were further changed after position 13-IV, another output monk 301 would start to align with another transmission peak 501 and the signal from power monitor 1200 would again increase. Hence the maximum at the control setting associated with petition 13-III is a local maximum.

In any event, when a local maximum is determined in the signal from power monitor 1200, control apparatus 105*c* determines that the given output mode is aligned with the given transmission peak. Furthermore, in some implementations, control apparatus 105*c* can then store the resulting control setting for the thermo-electric cooler in association with the given output mode, such that when the same given output mode is later selected, the same control setting can be used as the starting point for controlling the thermo-electric cooler. Otherwise device 100*c* functions similar to device 100.

In yet further implementations, device 100*c* can further comprise a wavelength monitor for monitoring a wavelength of light emitted from optical filter 103*c* to further ensure that the light emitted from optical filter 103*e* is the wavelength that was meant to be selected.

Figure 15:
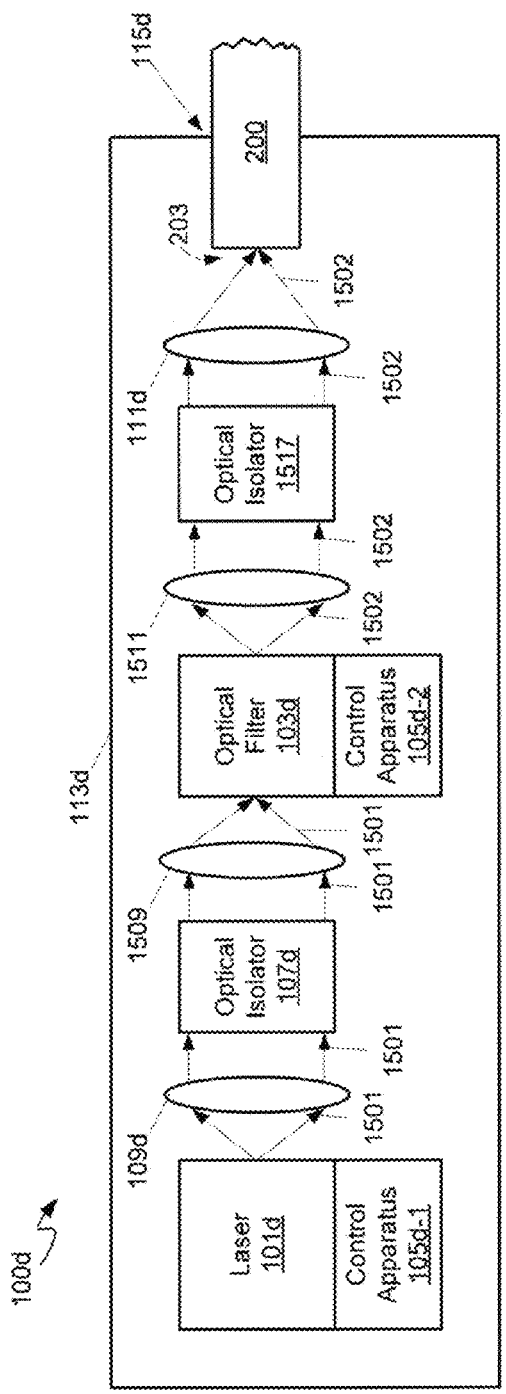
FIG. 15 depicts a schematic diagram of an alternative discretely tunable laser device with an active optical filter, according to non-limiting implementations.

Attention is next directed to FIG. 15 which depicts yet a further alternate implementation of a discretely tunable laser device 100*d* and paths of light 1501 and filtered light 1502 similar to paths of light 201 and filtered light 202 in FIG. 2. FIG. 15 also depicts laser device 100*d* coupled to an optical fiber 200 having an input 203. Laser device 100*d* will interchangeably referred to hereafter as device 100*d*. Device 100*d* is substantially similar to device 100 with like elements having like numbers but with a "d" appended thereto. Device 100*d* hence comprises a laser 101*d*, an optical filter 103*d*, a control apparatus 105*d*-1 for controlling laser 101*d*, an optical isolator 107*d*, lenses 109*d*, 111*d*, packaging 113*d* and an apparatus 115*d* for receiving optical fiber 200. However, in these implementations, optical filter 103*d* comprises a tunable passive filter, wherein a position of transmission peaks 501 associated therewith can be tuned. For example, optical filter 103d can comprise one or more of a temperature-tunable etalon, or dielectric filter similar to filters 103-103c. In yet further implementations, tunable optical filter 103d can comprise one or more of a Fabry-Perot Laser and a quantum dot laser similar to laser 101d, which can also amplify the output received from laser 101d. In other words, in these implementations, tunable optical filter 103d can comprise a tunable active filter. Either way, a plurality of transmission peaks of optical filter 103d are hence also tunable and thus device 101d further comprises a second control apparatus 105d-2 for tuning the plurality of transmission peaks of optical filter 103d to further align a given output mode with a given transmission peak.

Furthermore, as optical filter 103d comprises a laser similar to laser 101d, device 100d optically further comprises a lens 1509, similar to lens 111, for focusing light onto an entrance of optical filter 103d. Filtered light 1502 emerging from optical filter 103d then optionally passes through a lens 1511 which collimates filtered light 1502 into another optical isolator 1517, similar to optical isolator 107, to prevent light from being reflected back into optical, filter 103d and to prevent optical coupling with optical fiber 200. In general lenses 1509, 1511 are used when optical filter 103d comprises and active tunable optical filter as light 1501 is focussed into an active area of the Fabry-Perot laser and/or the quantum dot laser. In implementations where optical filter 103d comprises a passive tunable optical filter, however, lenses 1509, 1511 can be optional as light 1501 entering optical filter 103d can be collimated, as in FIG. 2. In any event, lens 111d then focuses filtered light 1502 emerging from optical isolator 1517 onto input 203 of optical fiber 200 as in FIG. 2.

In devices 100-100c, the corresponding optical filters 103-103c are passive filters. Hence, once a passive filter is selected and integrated into devices 100-100c, transmission peaks 501 are fixed and all tuning of devices 100-100c occurs at the respective laser 101-101c.

In contrast, and to provide better versatility in tuning device 100d, optical filter 103d comprises a tunable optical filter that can itself be tuned. For example, control apparatus 105d-2 can comprise a respective thermo-electric cooler and a respective processor (which alternatively can be external to device 100d as in FIG. 10), and the respective processor can control the respective thermo-electric cooler to position transmission peaks 501 as described above with regard to positions of output modes 301 of laser 101 and FIGS. 1 to 8. Specifically, control apparatus 105d-2 can access a table similar to table T1, and the like, for determining control settings for the respective thermo-electric cooler to control transmission peaks 501 to a given position. However, in implementations where optical filter 103d comprises a tunable passive optical filter, it is appreciated that tuning of transmission peaks 501 by heating and cooling occurs by virtue of changing an optical path length within optical filter 103d; i.e. as a temperature of optical filter 103d chances, optical filter 103d expands or contract thereby changing the optical path length. Furthermore, in implementations where optical filter 103d comprises a tunable active optical filter, it is appreciated that tuning of transmission peaks 501 by heating and cooling occurs similar to that of laser 101 above; furthermore, in these implementations, control apparatus 105d-2 can be enabled to tune optical filter 103d by one or more of a thermo-electric cooler and a current control apparatus for controlling current to optical filter 103d, as described above with reference to laser 101 and control apparatus 105.

In some implementations, control apparatus 105d-2 can tune transmission peaks 501 to maximize output of a given output mode of laser 101d. In other implementations, control apparatus 105d-2 can tune transmission peaks 501 to a position associated with a different group of wavelengths having the same transmission peak spacing as an initial group of wavelengths.

For example, at a first control setting of control apparatus 105d-2, transmission peaks 501 can be positioned at wavelengths of the shorter wavelength portion of the telecommunications C-band, while at a second control setting of control apparatus 105d-2, transmission peaks 501 can be positioned at wavelengths of the longer wavelength portion of the telecommunications C-band, thereby providing further versatility of device 100d. In other words, such group tuning can be used to increase a tuning range of device 101 by providing fewer output modes 301 at laser 101 and fewer transmission peaks 501 but then shifting each to obtain a particular output wavelength.

Figure 16:
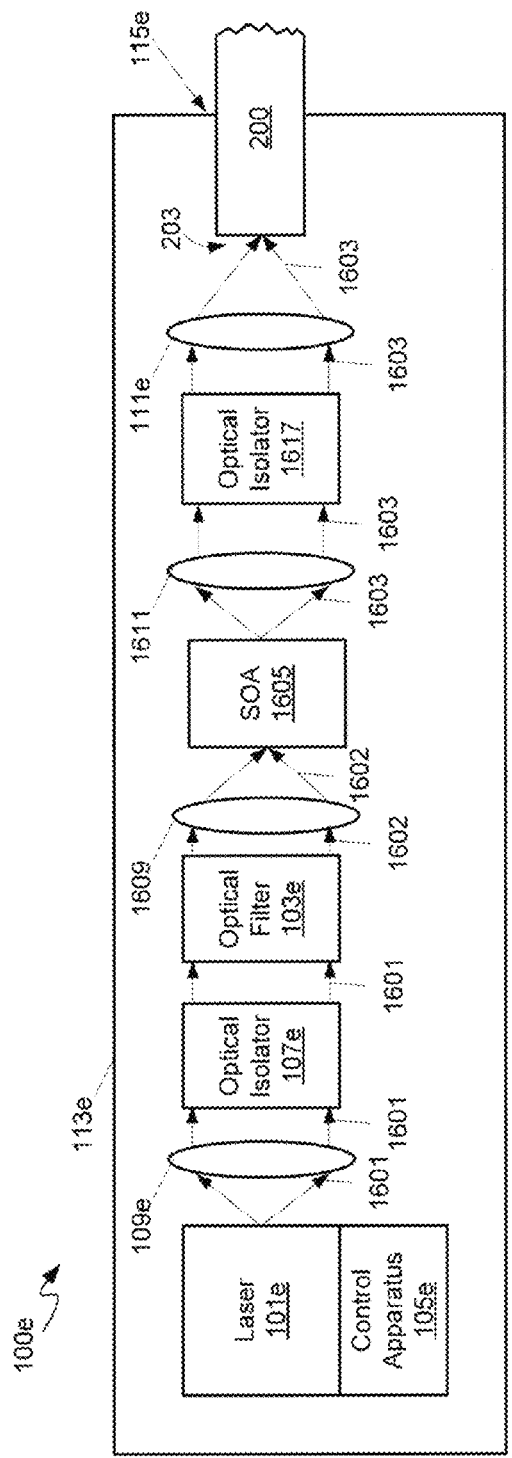
FIG. 16 depicts a schematic diagram of an alternative discretely tunable laser device with a solid-state optical amplifier, according to non-limiting implementations.

Attention is next directed to FIG. 16 which depicts yet a further alternate implementation of a discretely tunable laser device 100e and paths of light 1601, filtered light 1602, and amplified filtered light 1603. FIG. 16 also depicts laser device 100e coupled to an optical fiber 200 having an input 203. Laser device 100e will be interchangeably referred to hereafter as device 100e. Device 100e is substantially similar to device 100 with like elements having like numbers but with an "e" appended thereto. Device 100e hence comprises a laser 101e, an optical filter 103e, a control apparatus 105e for controlling laser 101e, an optical isolator 107e, lenses 109e, 111e, packaging 113e and an apparatus 115e for receiving optical fiber 200. However, in these implementations, device 100e further comprise a semiconductor optical amplifier (SOA) 1605 for receiving filtered light 1602 from optical filter 103e and a lens 1609 for focussing collimated filtered light 1602 onto an input of SOA 1605. Amplified light 1603 is then received at a lens 1611 which collimates amplified light 1603 into an optical isolator 1617, similar to optical isolator 107, for optically isolating SOA 1605 from optical fiber 200.

SOA 1605 can comprise any suitable optical amplifier. As appreciated by persons of skill in the art, an optical amplifier comprises a gain medium without an optical cavity and/or a laser in which feedback from the optical cavity is suppressed. Hence, lenses 1609, 1611 and optical isolator 1617 respectively focus light 1602 into SOA 1605, collimate light 1603 output from SOA 1605 and optically isolate SOA 1605 from upstream optical components.

Heretofore, modulation in devices 100-100e has not been described. However, it is appreciated that each of lasers 101-101e can be modulated in order to incorporate data from transmission into light produced by devices 100-100e. While slow, in device 100e, modulation can also occur via SOA 1605 by one or more of turning on and off, and controlling SOA 1605 between a high amplification state and a low amplification state. For example, it is appreciated that data can be encoded into output from device 100e by controlling SOA 1605 between one or more of a high amplification state and a low amplification state such that output from device 100e is controlled between a high state and a low state where a first amplitude of output of device 100e in the high state is higher than amplitude of a second amplitude of output of device 100e in the low state, the high state and low state corresponding to binary data states, such as a "1" and a "0". Hence, control of SOA 1605 between the between a high amplification state and a low amplification state according to a data input (not depicted), for example, results in modulated output of device 100e such that data can be transmitted via optical fiber 200.

It is yet further appreciated that while specific non-limiting implementations have been described, there are yet more alternative implementations and modifications possible. For example, a power meter similar to power meter 1200 can be incorporated into any of devices 100, 100a, 100b, 100d, 100e. Similarly, a tunable optical filter can be substituted for any passive optical filter described herein with appropriate lenses and optical isolators. Further, an amplifier similar to SOA 1605 can be incorporated into any of 100, 100a, 100b, 100c, 100d.

Furthermore, while implementations have been described with regard to telecommunications uses, such as providing transmission peaks that correspond to wavelengths in a communications band, present implementations are not so limited. For example, transmission peaks of optical filters described herein can correspond to wavelengths associated with medical devices and any other suitable device and/or use.

In any event, described herein are various discretely tunable laser device which combine tunable Fabry-Perot lasers, and the like, having discrete output modes, with optical filters for discretely selecting each of the discrete output modes by tuning a position of the discrete, output modes such that a given output aligns with a transmission peak of the optical filter. Hence, a single laser device can be manufactured with selectable output modes. Furthermore, by eliminating moving parts in present laser devices, they can be manufactured for significantly less cost than other mechanically tuned laser. In addition, in present optical communication devices, in the absence of a tunable laser, a unique laser must be used for each unique desired wavelength; for example, in ITU-grid compatible devices, a plurality of different lasers must be used, one for each wavelength in a telecommunications band, and hence each different laser must be uniquely sourced and stored. For example the number of different lasers can range between 2 and 160 in some optical communications systems. Present implementations eliminate a need to source a unique laser for each wavelength as each unique laser can be replaced with a single laser as described herein tuned to a given wavelength. Overhead costs of sourcing, tracking, and maintaining an inventory of a plurality of unique lasers are hence also reduced.

Figure 17:
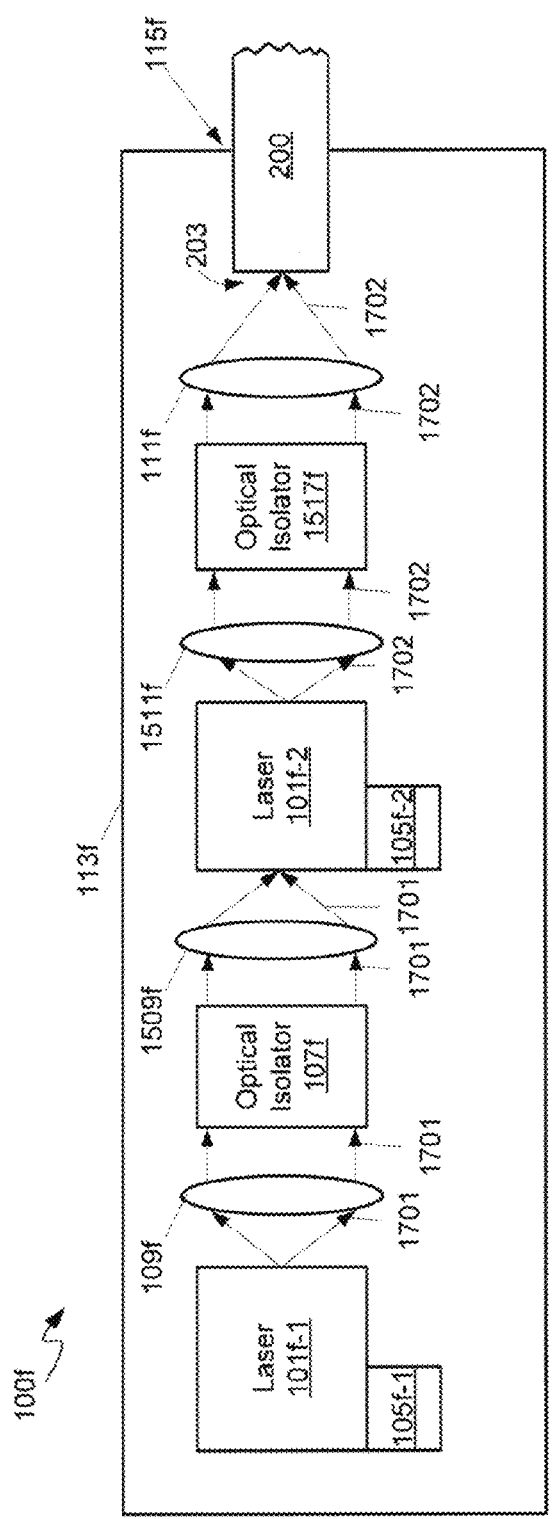
FIG. 17 depicts a schematic diagram of a discretely tunable locally seeded laser device, according to non-limiting implementations.

Attention is next directed to FIG. 17 which depicts a non-limiting implementation of a discretely tunable locally seeded laser device 100f, as well as paths of light 1701, and filtered light 1702 in laser device 100f. FIG. 17 also depicts laser device 100f coupled to an optical fiber 200 having an input 203. Laser device 100f will be interchangeably referred to hereafter as device 100f. Device 100f is substantially similar to device 100d with like elements having like numbers but with an "f" appended thereto rather than a "d". Device 100f hence comprises a first tunable laser 101f-1 (similar to laser 101d), a control apparatus 105f-1 (similar to control apparatus 105d) for controlling laser 101f-1, optical isolators 107f, 1517f, lenses 109f, 111f, 1509f, 1511f, packaging 113f, and an apparatus 115f for receiving optical fiber 200. However, in these implementations, rather than an optical filter located after laser 101f-1, device 100f comprises a second tunable laser 101f-2, and a control apparatus 105f-2 for controlling second tunable laser 101f-2.

In general, device 100f comprises: first tunable laser 101f-1 comprising first discrete output modes; second tunable laser 101f-2 arranged to receive output from first tunable laser 101f-1, but otherwise optically isolated from first tunable laser 101f-1, second tunable laser 101f-2 comprising second discrete output modes, and one first discrete output mode optically seeds a substantially aligned second discrete output mode in a given position of one or more of the first discrete output modes and the second discrete output modes such that the aligned second discrete output mode comprises a dominant discrete output mode.

First tunable laser 101f-1 will be interchangeably referred to hereafter as laser 101f-1, and second tunable laser 101f-2 will be interchangeably referred to hereafter as laser 101f-2. Furthermore, lasers 101f-1, 101f-2 will be referred to collectively as lasers 101f, and genetically as a laser 101f. Further, control apparatus 105f-1, 105f-2 will be referred to collectively as control apparatus 105f, and genetically as a control apparatus 105f.

Figure 18:
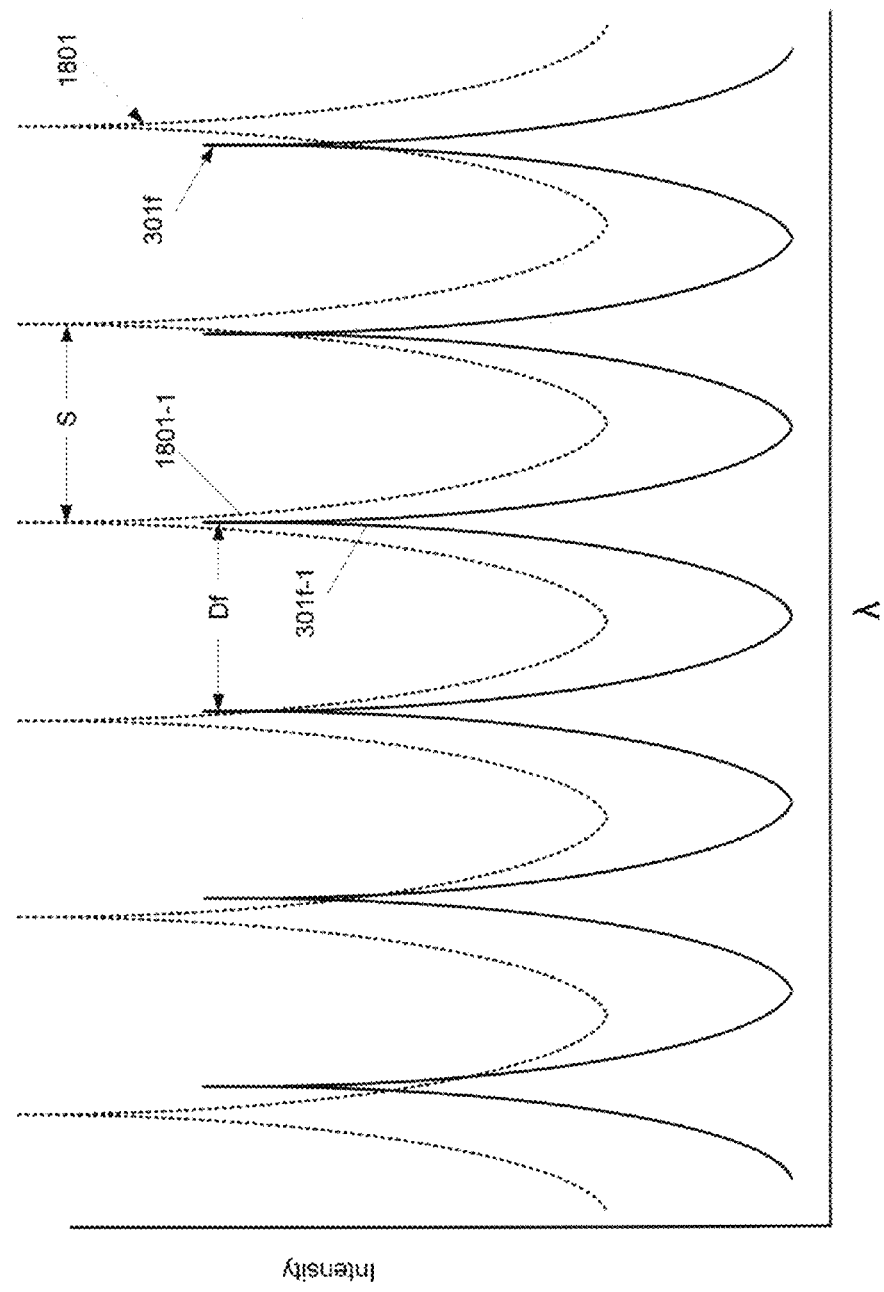
FIG. 18 depicts a graph of a subset of discrete output modes of each of two lasers in the discretely tunable laser device of FIG. 17, according to non-limiting implementations.

In general, and with reference to FIG. 18, which depicts output modes of lasers 101f as a function of wavelength, laser 101f-1 comprises first discrete output modes 301f similar to laser 101. Similarly, laser 101f-2 comprises second discrete output modes 1801 similar to laser 101. However, while second discrete output modes 1801 are depicted in FIG. 18, it is appreciated that second tunable laser 101f-2 is enabled to be driven to a given drive current and further comprises a reflectivity such that, in the absence of optical seeding, a gain of laser 101f-2 is not sufficient for lasing to occur with the combination of the given drive current and the reflectivity. In other words, the reflectivity is such that, for the given drive current, laser 101f-2 operates below a lasing threshold in the absence of optical seeding. In other words, the given drive current comprises an operating drive current of laser 101f-2.

Further, with reference to FIG. 18, it is appreciated that one or more of lasers 101f can be tuned using respective control apparatus 105f such that one first discrete output mode 301f-1 of laser 101f-1 aligns with a second discrete output mode 1801-1 of laser 101f-2 to optically seed aligned second discrete output mode 1801-1 at laser 101f-2. While described in further detail below, it is appreciated that spacings of each of first discrete output modes 301f and second discrete output modes 1801 are such that only one discrete output mode 301f is substantially aligned with one discrete output mode 1801 at given positions of either first discrete output modes 301f and second discrete output modes 1801.

Figure 19:
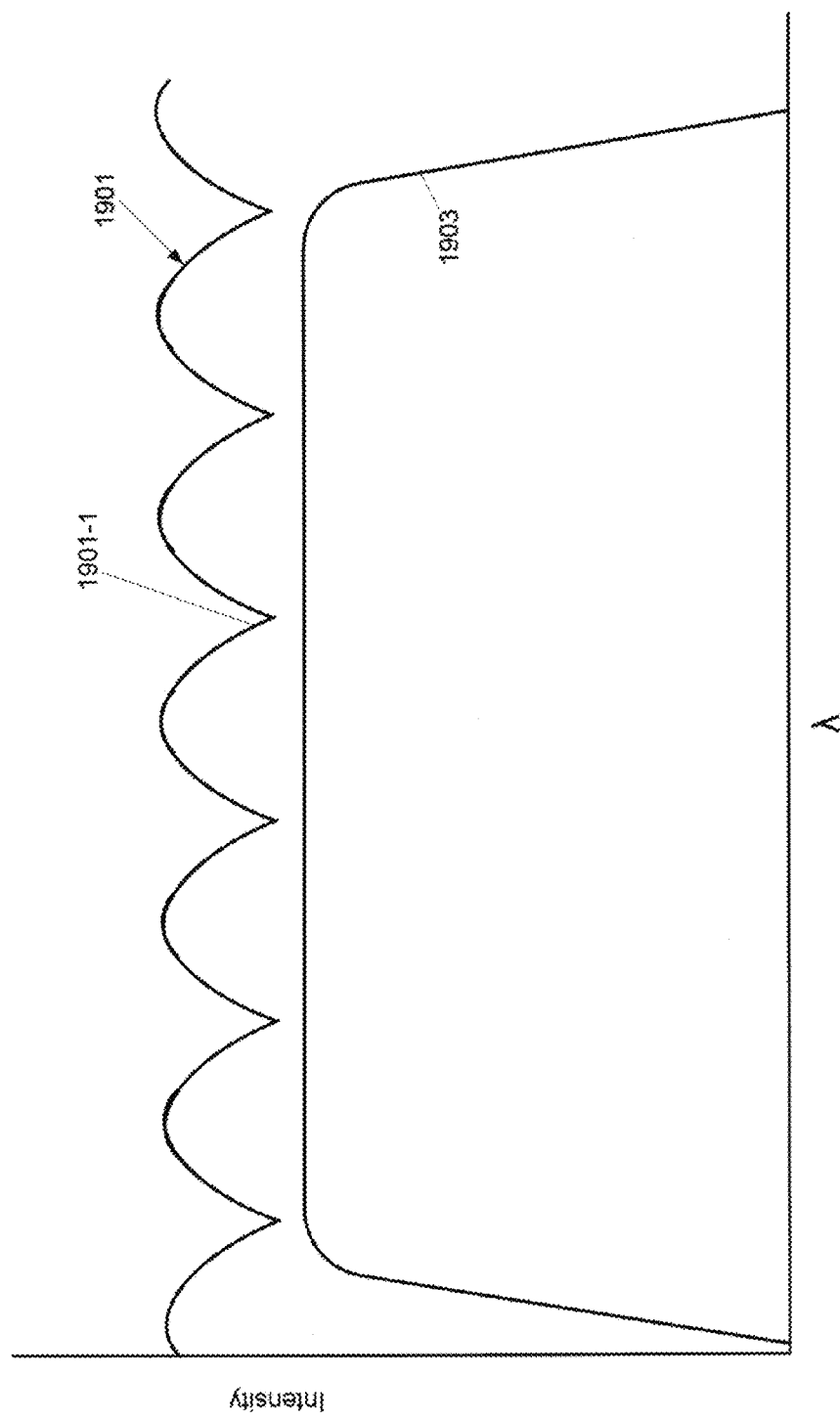
FIG. 19 depicts a graph of a subset of modes thresholds and a gain curve in a seeded laser in the discretely tunable laser device of FIG. 17, according to non-limiting implementations.

Attention is next directed to FIG. 19, which depicts a gain threshold curve 1901 of laser 101f-2, wherein each mode threshold of gain threshold curve 1901 corresponds to a respective discrete output mode 1801 depicted in FIG. 18. For example, mode threshold 1901-1 corresponds to discrete output mode 1801-1. FIG. 19 further depicts a gain curve 1903 of laser 101f-2 at a given drive current. In order for lasing to occur (i.e. in order for light to be emitted from laser 101f-2), gain curve 1903 must meet one or more of the mode thresholds of gain threshold curve 1901. In the absence of optical seeding, (e.g. from laser 101f-1), the combination of reflectivity and drive current of laser 101f-2 is chosen so that gain of laser 101f-2 is not sufficient for lasing to occur. Put another way, laser 101f-2 is enabled to be driven to a given drive current and further comprises a reflectivity such that, in the absence of optical seeding, gain of second tunable laser 101f-2 is not sufficient for lasing to occur with the combination of the given drive current and the reflectivity. In other words, gain curve 1903 does not meet any of the mode threshold of gain threshold curve 1901.

Figure 20:
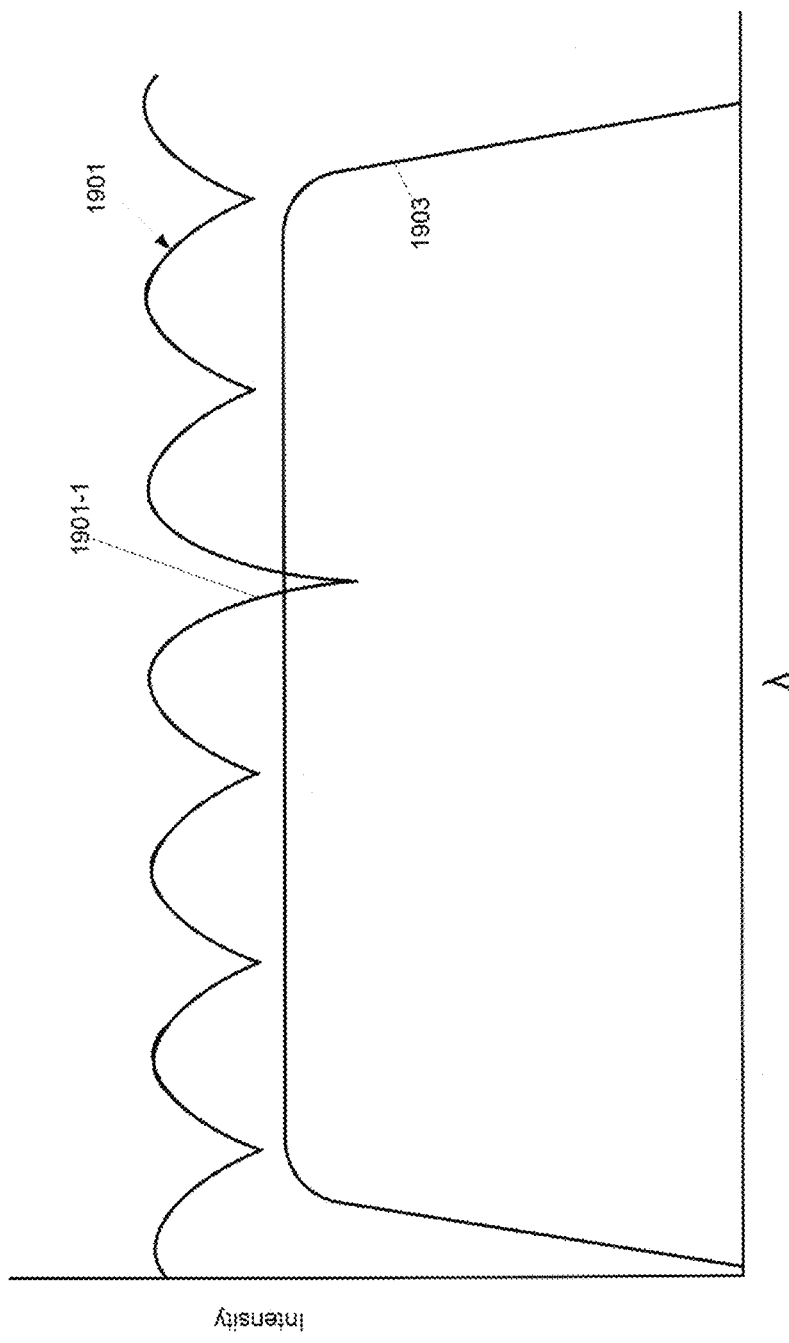
FIG. 20 depicts a graph of a subset of modes thresholds and a gain curve in a seeded laser in the discretely tunable laser device of FIG. 17, with one discrete output mode being seeded by a first laser, according to non-limiting implementations.

It is further appreciated that the state of laser 101f-2 depicted in FIG. 19 is in the absence of optical seeding. However, attention is next directed to FIG. 20, which is similar to FIG. 19, but it is assumed in FIG. 20 that laser 101f-2 is receiving output from laser 101f-1 and hence discrete output mode 301f-1 is aligned with discrete output mode 1801-1. Hence, corresponding mode threshold 1901-1 crosses gain curve 1903, while the other mode thresholds of gain threshold curve 1901 are generally unaffected. While other mode thresholds of gain threshold curve 1901 could be affected when some degree of alignment occurs between another discrete output mode 301*f* of laser 101*f*-1 and a further discrete output mode 1801 of laser 101*f*-2, the corresponding mode threshold is generally not affected to the degree of the specifically aligned discrete output mode 1801-1.

Hence, in order to choose an output wavelength of device 100*f*, one of discrete output modes 301*f* is aligned with one of discrete output modes 1801 similar to aligning one of discrete output modes 301 with one of transmission peaks 501 as described above such that the aligned discrete output mode 1801 comprises a dominant output of device 100*f*. It is appreciated that one or more of lasers 101*f* comprises a Fabry-Perot Laser. Furthermore, as described above, further lasers 101*f* can be chosen based on RIN requirements of a system into which laser device 100*f* is to be implemented, including, but not limited to, bulk lasers, quantum well lasers, quantum wire lasers and quantum dot lasers. In general, Fabry Perot lasers made with quantum dot material provide the lowest RIN in this list, and in implementations where low RIN is required, each of lasers 101*f* comprise a Fabry-Perot quantum dot laser, as described above. However, laser types other than quantum dot lasers could be used, depending on system RIN requirements.

Furthermore, each of lasers 101*f* are controlled using a respective control apparatus 105*f*, as described above with respect to control apparatus 105. Hence, laser device 100*f* comprises at least one control apparatus 105*f* for tuning a position of one or more of discrete output modes 301*f* of first tunable laser 101*f*-1 and second discrete output modes 1801 of second tunable laser 101*f*-2. Each of control apparatus 105*f* can comprise one or more of a thermo-electric cooler and a current control apparatus, as also described above. While not depicted, it is further appreciated that laser device 100*f* can further comprise: at least one memory for storing output settings of at least one control apparatus 105*f* for tuning the positions of one or more of first discrete output modes 301*f* of laser 101*f*-1 and second discrete output modes 1801 of second tunable laser 101*f*-2. In other words, laser device 100*f* stores data similar to table 1 for tuning lasers 101*f*.

In some implementations, only one of lasers 101*f* is tuned to align discrete output modes 301*f*, 1801, but each laser 101*f* is nonetheless controlled via the respective control apparatus 105*f* if only to maintain a relative position of respective discrete output modes; in other words, the control settings of one of lasers 101*f* can be kept constant while the other laser 101*f* is tuned.

With reference to FIG. 18, it is yet further appreciated that discrete output modes 301*f* are separated by a spacing Df, similar to spacing D, and discrete output modes 1801 are separated by a spacing S different from spacing Df. One or more of spacing S and spacing Df is generally selected such that only one discrete output mode 301*f* can align with one discrete output mode 1801 at any given position of discrete output modes 301*f* and/or any given position of discrete output modes 1801 when one or more of discrete output modes 301*f* and discrete output modes 1801 are tuned. The conditions for selecting spacing S and/or spacing Df are similar to those described above with reference to selecting spacings of discrete output modes 301 and transmission peaks 501. Hence, one or more of spacing S and spacing Df is generally selected to achieve the desired single mode alignment to produce a dominant output mode. For example, in specific non-limiting implementations, a relationship between spacings S, Df can be determined by one of:

$$Df=S*(M-1)/M \qquad \text{Equation 3; and}$$

$$Df=S*(M+1)/M \qquad \text{Equation 4,}$$

where M is the number of discrete output modes of laser 101*f*-2 in an output band of laser 101*f*-1. It is appreciated that Equation 3 is generally similar to Equation 1, and Equation 4 is generally similar to Equation 2. Hence, similar conditions can be applied to spacings S, Df and as described above with reference to spacings G, D. Hence, in other implementations, Df can be an integer multiple of one of $S*(M-1)/M$ and $S*(M+1)/M$. It is further appreciated that the total bandwidth of device 100*f* is generally optically restricted to $S*M$, either by one or more of: explicit filtering; and restriction of gain curves of one or more of lasers 101*f*. In yet further implementations, Df can be determined by a subset of one of $S*(M-1)/M$ and $S*(M+1)/M$. For example, as both $S*(M-1)/M$ and $S*(M+1)/M$ each define a spacing between discrete output modes, Df can also be determined by a subset of the discrete output modes defined by one of $S*(M-1)/M$ and $S*(M+1)/M$, for example, even second discrete output mode, every third output mode, etc.

Hence, an aligned output mode of laser 101*f*-2 comprises a dominant output mode of device 100*f*. It is hence appreciated that output of device 100*f* is similar to output of device 100 as depicted in FIGS. 6 and 8, with one dominant output mode. It is further appreciated that side modes can be present in output of device 100*f*, similar to output of device 100 as depicted in FIGS. 6 and 8.

It is yet further appreciated that device 100*f* can be enabled to couple to an external modulating apparatus (not depicted). For example, apparatus 115*f* can be enabled to couple to an external modulating apparatus such that light emitted from device 100*f* can be modulated to encode data therein. In particular non-limiting implementations, apparatus 115*f* is enabled to couple to optical fiber 200 which comprises an input to an external modulating apparatus. However, any suitable coupling apparatus for coupling to an external modulating apparatus is within the scope of present implementations.

Figure 21:
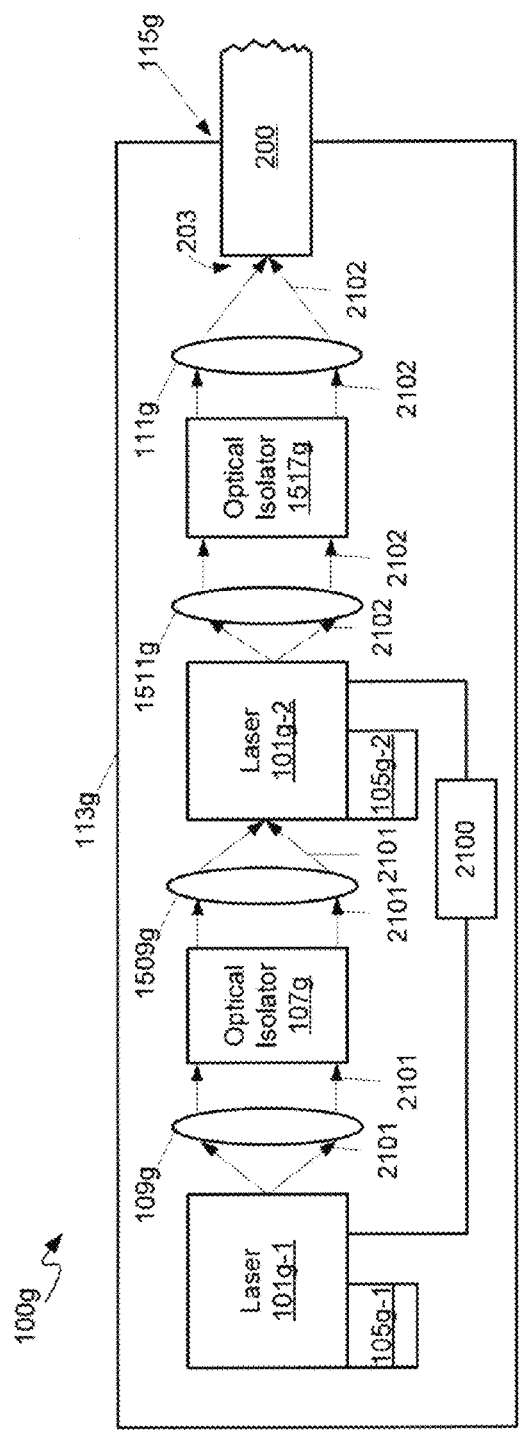
FIG. 21 depicts a schematic diagram of an internally modulated discretely tunable locally seeded laser device, according to non-limiting implementations.

Attention is next directed to FIG. 21 which depicts yet a further non-limiting implementation of a discretely tunable locally seeded laser device 100*g*, and paths of light 2101, and filtered light 2102 in device 100*g*. FIG. 21 also depicts laser device 100*g* coupled to optical fiber 200 having input 203. Laser device 100*g* will be interchangeably referred to hereafter as device 100*g*. Device 100*g* is substantially similar to device 100*f* with like elements having like numbers but with a "g" appended thereto rather than an "f". Device 100*g* hence comprises a tunable lasers 101*g*-1, 101*g*-2 (interchangeably referred to hereafter collectively as lasers 101*g* and generically as a laser 101*g*), control apparatus 105*g*-1 105*g*-2 (interchangeably referred to hereafter collectively as control apparatus 105*g* and generically as control apparatus 105*g*), for respectively controlling laser 101*g*-1, 101*g*-2, optical isolators 107*g*, 1517*g*, lenses 109*g*, 111*g*, 1509*g*, 1511*g*, packaging 113*g*, and an apparatus 115*g* for receiving optical fiber 200. However, in these implementations, device 100*g* further comprises at least one modulating apparatus 2100 for modulating one or more of an amplitude of first tunable laser 101*g*-1; and a gain of second tunable laser 101*g*-2, between two different optical seeding settings such that second tunable laser 101*g*-2 has two different output levels at an aligned second discrete output mode. Such modulation internal to device 100*g* can also be referred to as direct modulation, in contrast to external modulation.

While only one modulating apparatus 2100 is depicted in FIG. 21, in other implementations a modulating apparatus 2100 is provided for each of lasers 101g. Either way, modulating apparatus 2100 modulates amplitude of laser 101g-1 and/or gain of laser 101g-2 by modulating a drive current of each respective laser 101g.

It is yet further appreciated that modulated output of device 100g (e.g. into optical fiber 200) represents data to be transmitted (e.g. via optical fiber 200). Hence, while not depicted, device 100g can comprise an input (not depicted) interconnected with modulating apparatus 2100 for receiving data to be transmitted and modulating apparatus 2100 modulates one or more of lasers 101g accordingly. For example, output of device 100g can be modulated between a high state, indicative of a "1", and a low state, indicative of a "0" in order to transmit binary data via optical fiber 200. In other implementations, however, the low state can be indicative of "1" and the high state can be indicative of "0". Hence, output of device 100g can be indicative of data received via the input interconnected with modulating apparatus 2100, the data optically encoded into the output of device 100g for transmission via optical fiber 200; the optically encoded data can be decoded when the output of device 100g is received at a decoding endpoint device at an opposite end of optical fiber 200.

Figure 22:
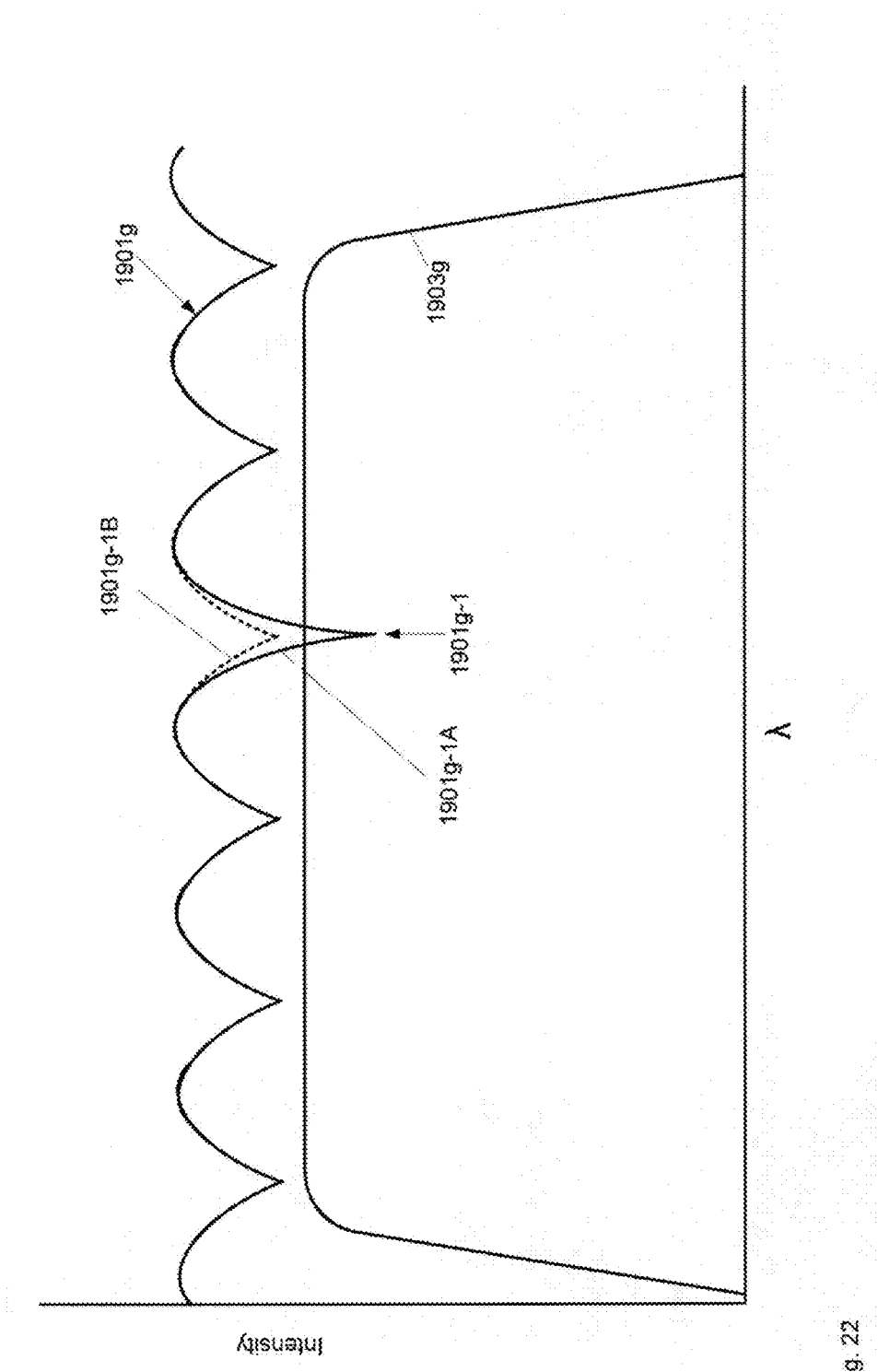
FIG. 22 depicts a graph of a subset of modes thresholds and a gain curve in a seeded laser in the discretely tunable laser device of FIG. 21, with one discrete output mode being seeded by a first laser in two different optical seeding settings, one above and one below a dominant mode threshold, according to non-limiting implementations.

In any event, attention is next directed to FIG. 22 which depicts a gain threshold curve 1901g of laser 101g-2, and a gain curve 1903g of laser 101g-2, similar to curves 1901, 1903 as described above with respect to FIGS. 19 and 20. In FIG. 22, it is assumed that one or more of lasers 101g have been tuned such that discrete output modes associated with mode threshold 1901g-1 have been aligned, as described above with reference to device 100f.

It is further assumed in FIG. 22 that an amplitude of laser 101g-1 is being modulated by modulating apparatus 2100 between two different optical seeding settings, for example, one or more of: an on state and an off state; and a high state and a low state. The amplitude of laser 101g-1 is controlled by modulating apparatus 2100 controlling the drive current of laser 101g-1 to a corresponding high state and a corresponding low stare. It is appreciated that, in these implementations, in the low state, laser device 101g-2 is not seeded as in FIG. 19, and in the high state, laser device 101g is seeded as in FIG. 20. Hence, FIG. 22 depicts mode threshold 1901g-1 in two states, 1901g-1A, 1901g-1B, with an output mode corresponding to mode threshold 1901g-1 being seeded by laser 101g-1 in state 1901g-1A and not seeded in state 1901g-1B.

Furthermore, it is appreciated that in state 1901g-1A, gain curve 1903g meets mode threshold 1901g-1, and in state 1901g-1B, gain curve 1903g does not meet mode threshold 1901g-1. Hence, in state 1901g-1A, laser light is emitted from device 100g at a wavelength corresponding to mode threshold 1901g-1, while in state 1901g-1B, laser light is not emitted from device 100g.

Hence, by first aligning a discrete output mode of laser 101g-1 with a discrete output mode of laser 101g-2, and controlling amplitude of laser 101g-1 between two different optical seeding levels, laser 101g-2 is controlled between two different output levels, corresponding to two different data states such as "1" and "0".

However, present implementations are not limited to one of the two different output states being an off-state. For example, attention is next directed to FIG. 23, which is similar to FIG. 22, however, in these implementations modulating apparatus 2100 controls amplitude of laser 101g-1 between two different optical seeding settings, a high setting and a low setting, as described above with regards to FIG. 22. Similarly, mode threshold 1901g-1 is controlled between two states 1901'g-1A and 1901'g-1B.

Figure 23:
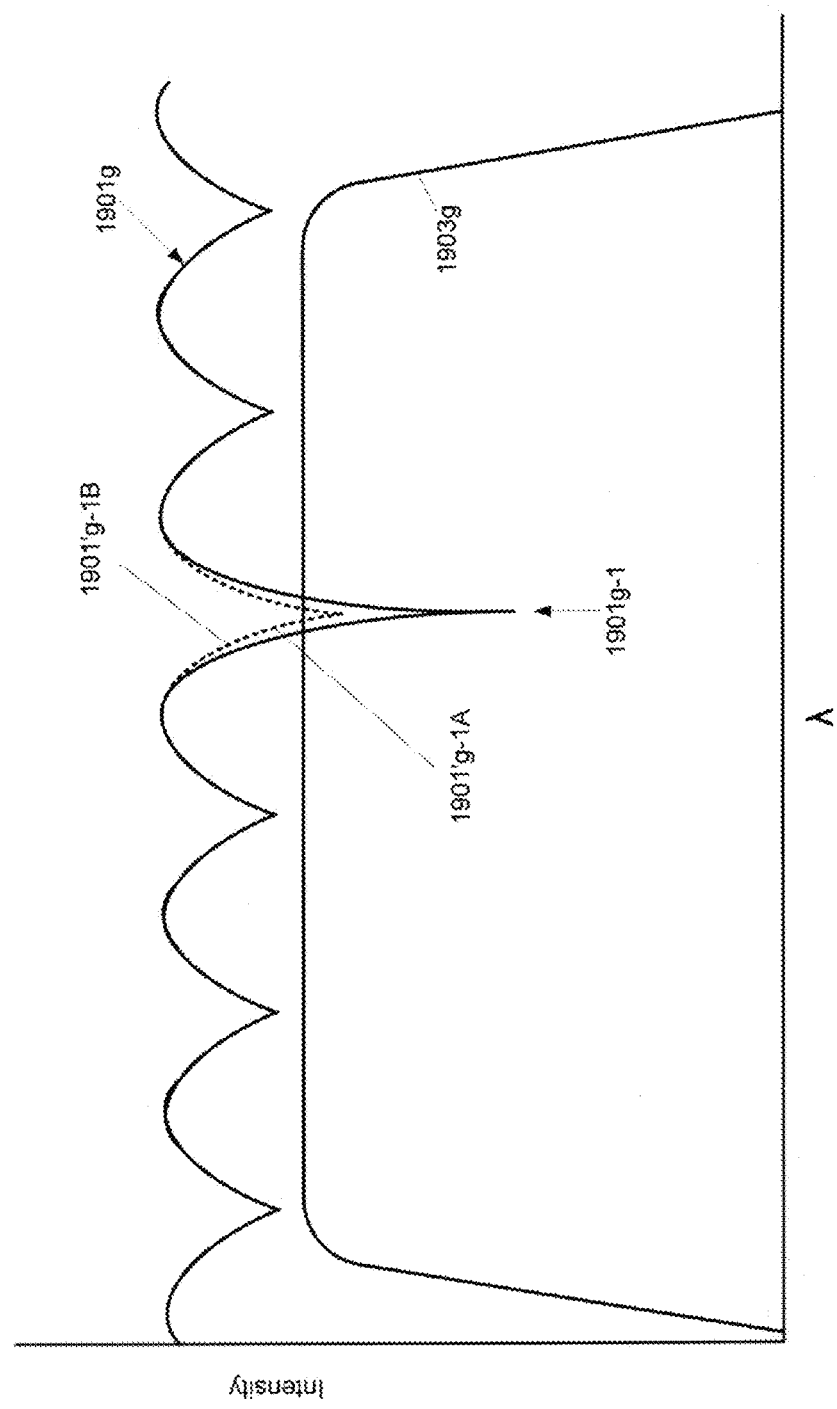
FIG. 23 depicts a graph of a subset of modes thresholds and a gain curve in a seeded laser in the discretely tunable laser device of FIG. 21, with one discrete output mode being seeded by a first laser in two different optical seeding settings, both above a dominant mode threshold, according to non-limning implementations.

In contrast to FIG. 22, it is appreciated that, in FIG. 23, gain curse 1903g meets mode threshold, 1901g-1 in each state 1901'g-1A, 1901'g-1B, and hence laser light is emitted from device 100g in each state 1901'g-1A, 1901'g-1B. However, in state 1901'g-1A, gain curve 1903g is farther over mode threshold 1901g-1 than in state 1901-40 g-1B, and hence amplitude of light emitted by device 100g will be higher in state 1901'g-1A than in state 1901'g-1B.

In other words, in these implementations, controlling amplitude of laser 101g-1 causes mode threshold 1901g-1 to change relative to gain curve 1903g, such that gain curve 1903g exceeds mode threshold 1901g-1 by two different amounts, and hence laser 101g-2 is controlled between two different output levels, corresponding to two different data states such as "1" and "0". Hence, at the low setting, laser light is output from device 100g at a first output level (e.g. a first amplitude) and at the high setting laser light is output from device 100g at a second output level higher than the first output level (i.e. a second amplitude higher than first amplitude), each of the two output levels corresponding to a low data state and a high data state, such as a "0" and a "1" respectively, or vice versa. However, at neither of the two different output levels is the amplitude of output of device 100g off.

Figure 24:
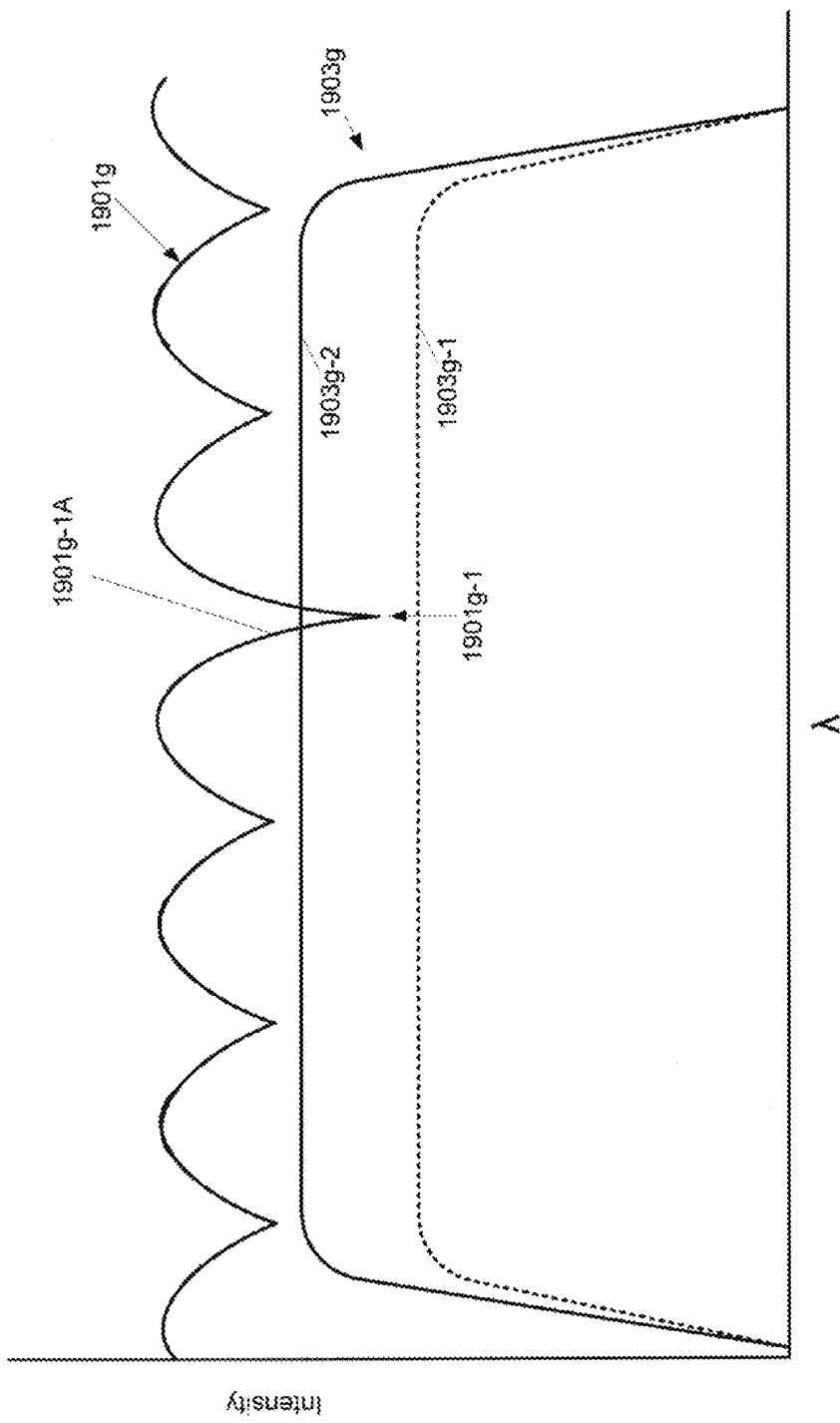
FIG. 24 depicts a graph of a subset of modes thresholds and a gain curve in a seeded laser in the discretely tunable laser device of FIG. 21, with one discrete output mode being seeded by a first laser, and the gain curve being modulated between two different states, one above and one below a dominant mode threshold, according to non-limiting implementations.

Present implementations are not limited, however, to controlling modulation by controlling laser 101g-1. Hence, attention is next directed to FIG. 24, which shows gain threshold curve 1901g of laser 101g-2, and gain curve 1903g of laser 101g-2, in two different optical seeding states 1903g-1, 1903g-2. In FIG. 24, it is again assumed that one or more of lasers 101g have been timed such that discrete output modes associated with mode threshold 1901g-1 have been aligned, as described above with reference to device 100f.

In other words, it is again assumed that laser 101g-2 is being seeded by laser 101g-1 at a discrete output mode 1901g-1A corresponding to mode threshold 1901g-1, as described above. However, in these implementations, modulating apparatus 2100 controls drive current of laser 101g-2 such that gain of laser 101g-2 is controlled between two different optical seeding settings, a high setting and a low setting. At the low setting, gain curve 1903g is in state 1903g-1 and does not meet mode threshold 1901g-1. At the high setting, gain curve 1903g is in a state 1903g-2 and meets mode threshold 1901g-1. Hence, at the high setting, laser light is output from device 100g and at the low setting laser light is not output from device 100g, again corresponding to a high data state and a low data state, such as a "1" and a "0" respectively, or vice versa.

Figure 25:
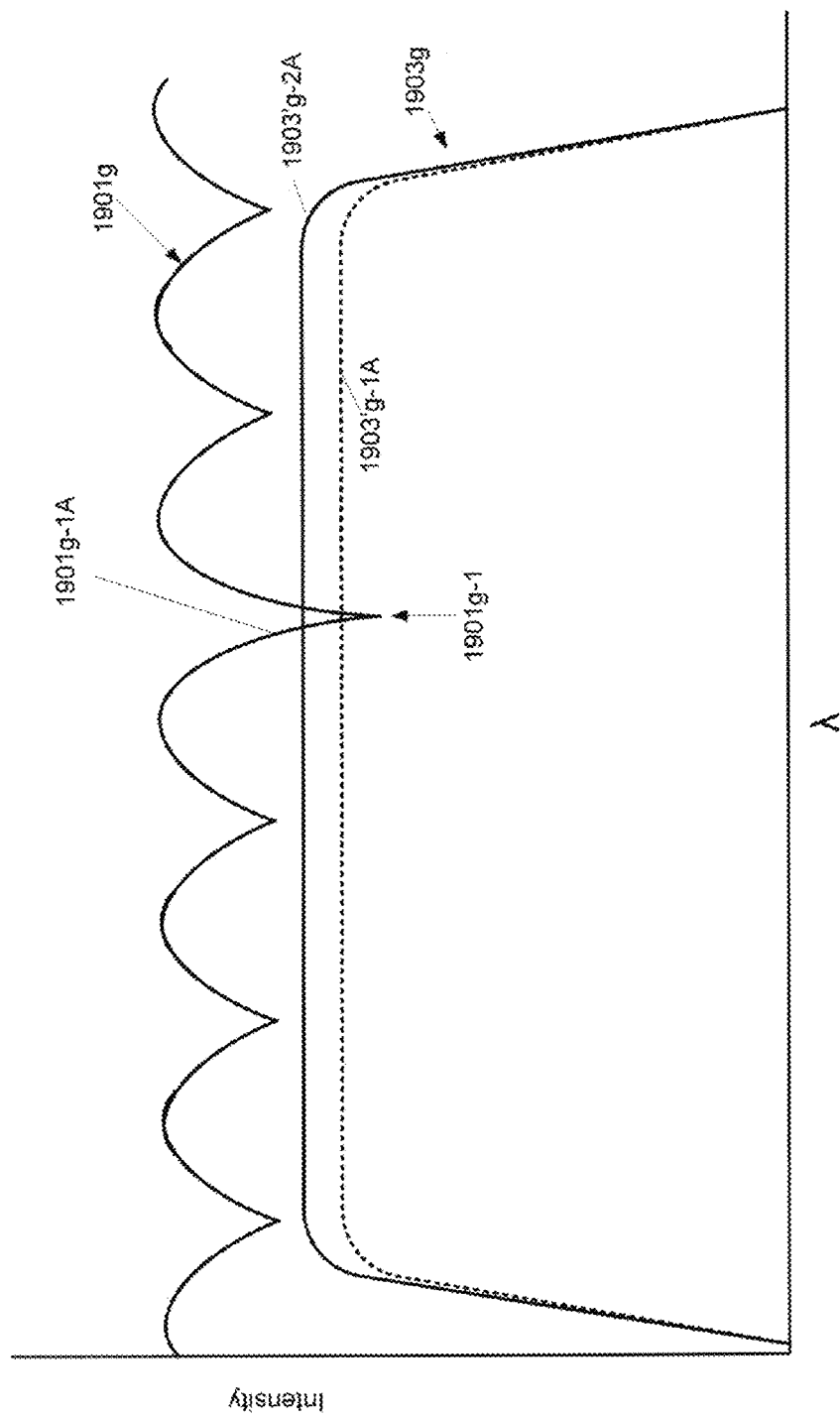
FIG. 25 depicts a graph of a subset of modes thresholds and a gain curve in a seeded laser in the discretely tunable laser device of FIG. 21, with one discrete output mode being seeded by a first laser, and the gain curve being modulated between two different states, both above a dominant mode threshold, according to non-limiting implementations.

Alternatively, modulating apparatus 2100 controls drive current of laser 101g-2 as depicted in FIG. 25 (substantially similar to FIG. 24), such that gain of laser 101g-2 is controlled between two different optical seeding settings, a high setting and a low setting. At the low setting, gain curve 1903g is in a state 1903'g-1A that exceeds mode threshold 1901g-1, and at the high setting, gain curve 1903g is in a state 1903'g-2A that exceeds mode threshold 1901g-2 by a greater amount than in state 1903'g-1.

Hence, at the low setting, laser light is output from device 100g at a first output level (e.g. a first amplitude) and at the high setting laser light is output from device 100g at a second output level higher than the first output level (i.e. a second amplitude higher than first amplitude), each of the two output levels corresponding to a low data state and a high data state, such as a "0" and a "1" respectively, or vice versa. However, at neither of the two different output levels is the amplitude of output of device 100g off.

It is yet further appreciated that, in further implementations, modulating apparatus can modulate both amplitude of laser 101g-1 and gain of laser 101g-2 to modulate light emitted from device 100g. In other words, a combination of controlling seeding by laser 101g-1 and controlling gain curve 1903 of laser 101g-2 can be used to modulate light from device 100g. To achieve this, modulating apparatus 2100 modulates drive current of both lasers 101g between respective low states and respective high states.

It is yet further appreciated that modulation of drive current at laser 101g-1 also results in modulation of gain at laser 101g-1; in other words, while the above discussion refers to modulation of amplitude of lasers 101g-1, a gain curve and a mode threshold curve of laser 101g-1 can be similar to gain curve 1903 and mode threshold curve 1901 of FIG. 19, and modulating apparatus 2100 controls drive current of laser 101g-1 between two different settings such that the respective gain curve of laser 101g-1 is modulated between two different threshold settings which results in two different output amplitudes.

In any event, at device 100g, an output mode is selected by adjusting a position of discrete output modes of one or more of lasers 101g-1, 101g-2 such that discrete output modes align, as described above. Further, modulating apparatus 2100 controls one or more of drive current at laser 101g-1 (to modulate amplitude of laser 101g-1) and drive current at laser 101g-2 (to modulate gain of laser 101g-2) to modulate the selected output modes. Furthermore, other output modes can be selected for modulating by again adjusting the position of the discrete output modes of one or more of lasers 101g-1, 101g-2 such that other discrete output modes align, as described above. Hence, device 100g can be both tuned to a plurality of discrete wavelengths and modulated at each of these wavelengths.

Figure 26:
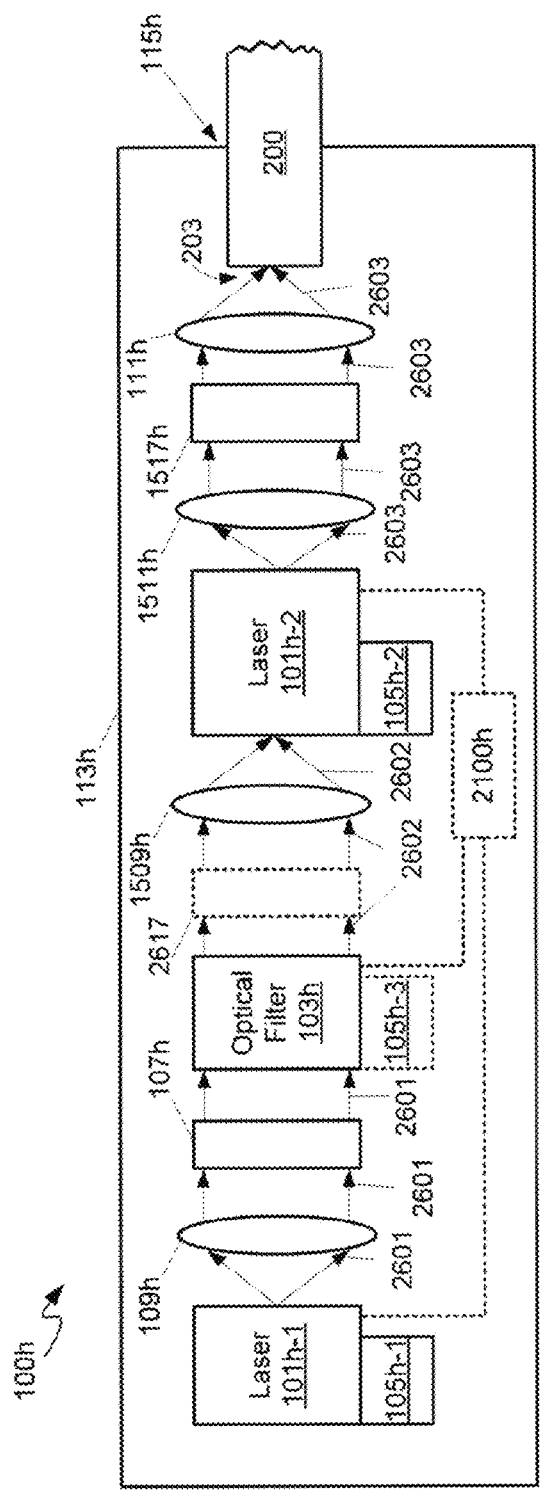
FIG. 26 depicts a schematic diagram of a discretely tunable locally seeded laser device with an optical filter to eliminate side modes and optional internal direct modulation, according to non-limiting implementations.

Attention is next directed to FIG. 26 which depicts an alternative discretely tunable locally seeded laser device 100h, as well as paths of light 2601, filtered light 2602, and output light 2603 in laser device 100h. FIG. 26 also depicts laser device 100h coupled to an optical fiber 200 having an input 203. Laser device 100h will be interchangeably referred to hereafter as device 100h. Device 100h is substantially similar to device 100g with like elements having like numbers but with an "h" appended thereto rather than a "g". Device 100h hence comprises a first tunable laser 101h-1, a second tunable laser 101h-2, respective control apparatus 105h-1, 105h-2, optical isolators 107h, 1517h, lenses 109h, 111h, 1509h, 1511h, packaging 113h, and an apparatus 115h for receiving optical fiber 200. Device 100h can optically comprise a modulating apparatus 2100h similar to modulating apparatus 2100. When modulating apparatus 2100h is not present, output from device 100h can be modulated externally as described above with reference to device 100f; indeed, like device 100f, device 100h can be enabled to couple to an external modulating device.

However, in these implementations, and in contrast to devices 100f, 100g, device 100h further comprises an optical filter 103h between laser 101h-1 and laser 101h-2 for passing one first discrete output mode of laser 101h-1 and substantially blocking remaining first discrete output modes of laser 101h-1. In other words, optical filter 103h is similar to one or more optical filters 103, 103a, 103b, 103c, 103d, and 103e. It is further appreciated that optical filter 103h can hence comprise a passive optical filter, a tunable passive optical filter or a tunable active optical filter.

When optical filter 103h comprises a passive optical filter, optical filter 103h can comprise an etalon as described above.

When optical filter 103h comprises a tunable optical filter, device 100h further comprises a control apparatus 105h-3 for tuning a position of transmission of peaks of optical filter 103h as described above with reference to optical filter 103d. Hence, control apparatus 105h-3 is depicted in FIG. 26 with stippled lines indicating that it is optional, depending on whether or not optical filter 103h is tunable. In some of these implementations, optical filter 103h can comprise tunable passive filter and hence control apparatus 105h-3 comprises a thermo-electric corner for expanding and contracting optical filter 103h.

Whether optical filter 103h comprises a passive optical filter, or a tunable passive optical filter, optical filter 103h comprises transmission peaks, each separated by a transmission spacing different from a spacing of first discrete output modes of laser 101h-1 such that only the one first discrete output mode can predominantly align with one transmission peak when the first discrete output modes are tuned, as described above with reference to FIGS. 3 to 8. Hence, a spacing of first discrete modes of laser 101h-1 is determined by one or more of Equation 1, Equation 2, integer multiples thereof and a subset of modes thereof, and/or any other suitable criteria.

When optical filter 103h comprises an active optical filter, control apparatus 105h-3 comprises a thermo-electric cooler for controlling a temperature of optical filter 103h to control a position discrete output modes. In other words, in these implementations, optical filter 103h can comprise a seeded laser, such that the combination of laser 101h-1 and optical filter 103h is similar to laser 101f-1 and laser 101f-2 of device 100f. Hence, a spacing of first discrete modes of laser 101h-1 is determined by one or more of Equation 3, Equation 4, integer multiples thereof and a subset of modes thereof, and/or any other suitable criteria. Further, in these implementations, an optional optical isolator 2617 is between optical filter 103h and laser 101h-2 to prevent optical coupling therebetween.

While not depicted, in some implementations, device 100h can further comprise lenses for focussing light 2601 into optical filter 103h, and collimating filtered light 2602 emitted from optical filter 103h; for example, in implementations where optical filter 103h comprises an active tunable optical filter, device 100h can comprise a set of lenses similar to lenses 1509f, 1511f, as well as optional optical isolator 2617.

In any event, filtered light 2602 from optical filter 103h comprises one dominant discrete mode, selected by tuning one or more of laser 101h-1 and optical filter 103h. The one dominant discrete mode is used to seed laser 101h-2 as described above. Further, modulating apparatus 2100h can modulate one of laser 101h-1 and laser 101h-2 to produce modulated output from device 101h. Further, in implementations where optical filter 103h comprises an active optical filter, such as a seeded laser, output from device 100h can be modulated via modulating apparatus 2100 modulating optical filter 103h, hence, in FIG. 26, modulating apparatus 2100h is depicted being optionally interconnected with optical filter 103h.

The advantage of optical filter 103h is to substantially eliminate side modes from device 100h, side modes being modes that are somewhat but not substantially in alignment, similar to FIGS. 6 and 8; as the intensity of side modes are reduced due to optical filter 103h, unintentional seeding of side modes at laser 101h-2 is also reduced and/or eliminated.

Figure 27:
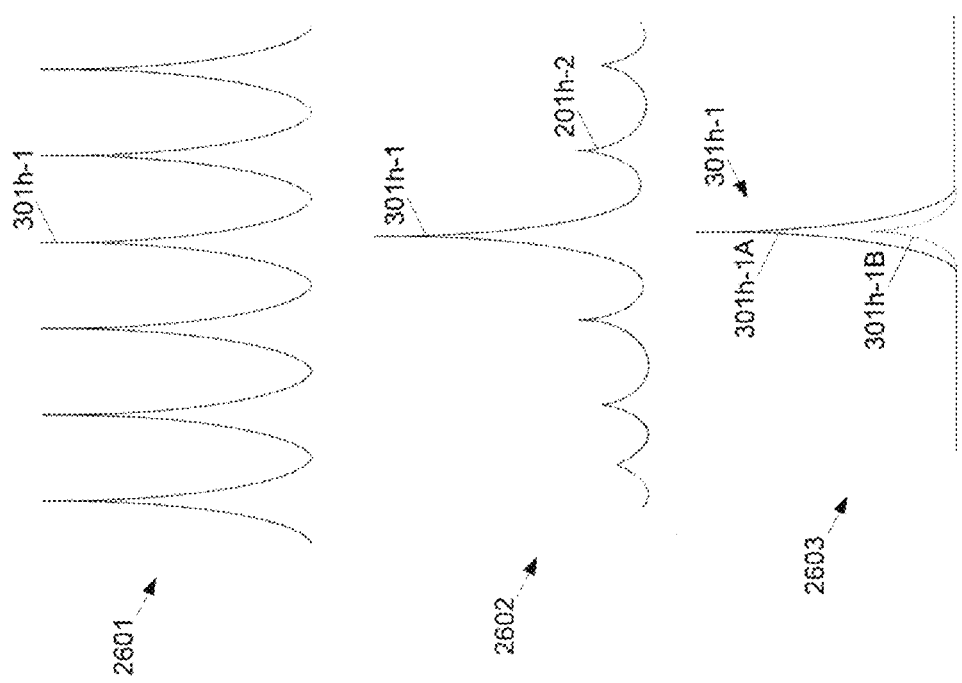
FIG. 27 depicts first laser output, optical filter output, and modulated second filter output of the discretely tunable laser device of FIG. 26, according to non-limiting implementations.

This is further depicted in FIG. 27, which depicts details of light 2601 output by laser 101h-1, filtered light 2602 filtered by optical filter 103h and light 2603 output from laser 101h-2, according to non-limiting implementations. From FIG. 27, it is appreciated that light 2601 from laser 101*h*-1 comprises a plurality of discrete output modes, including a discrete output mode 301*h*-1. One or more of laser 101*h*-1 and optical filter 103*h* is tuned to produce filtered light 2602 where discrete output modes 301*h*-1 comprises a dominant discrete output mode; however, filtered light 2602 also comprises side modes, such as side mode 301*h*-2 which occur due to partial alignment of discrete output modes of laser 101*h*-1 and transmission peaks of optical filter 103*h* (or discrete output modes of optical filter 103*h*). While these side modes can produce some seeding at laser 101*h*-2, the seeding is generally not high enough to cause output at laser 101*h*-2 and/or if seeding is high enough to cause output at laser 101*h*-2 the output for the side modes is low compared to a dominant output modes.

In any event, output light 2603 is depicted as modulated between a first (high) output level 301*h*-1A and a second output level 301*h*-1B, with discrete output mode 301*h* comprising a dominant output mode. Side modes are appreciated to be predominantly eliminated.

Persons skilled in the art will appreciate that there are yet more alternative implementations and modifications possible. For example, while not depicted, any optical isolators described herein can be omitted by optically decoupling the lasers, optical filters and other optical components described herein. For example, components can be optically isolated using an off-normal angle between an output area of a first component and an input area of a second component, as in device 100*b*. For example, optical isolator 107*f* of device 100*f* could be replaced when there is an off-normal angle between an output facet of first tunable laser 101*f*-2 and an input facet of second tunable laser 101*f*-2. It is appreciated that other optical components therebetween can also be at an off-normal angle to the output facet of first tunable laser 101*f*-1. Alternatively, input faces of the other optical components can be coated with a suitable anti-reflective coating to prevent light from reflecting back into first tunable later 101*f*-1.

Figure 28:
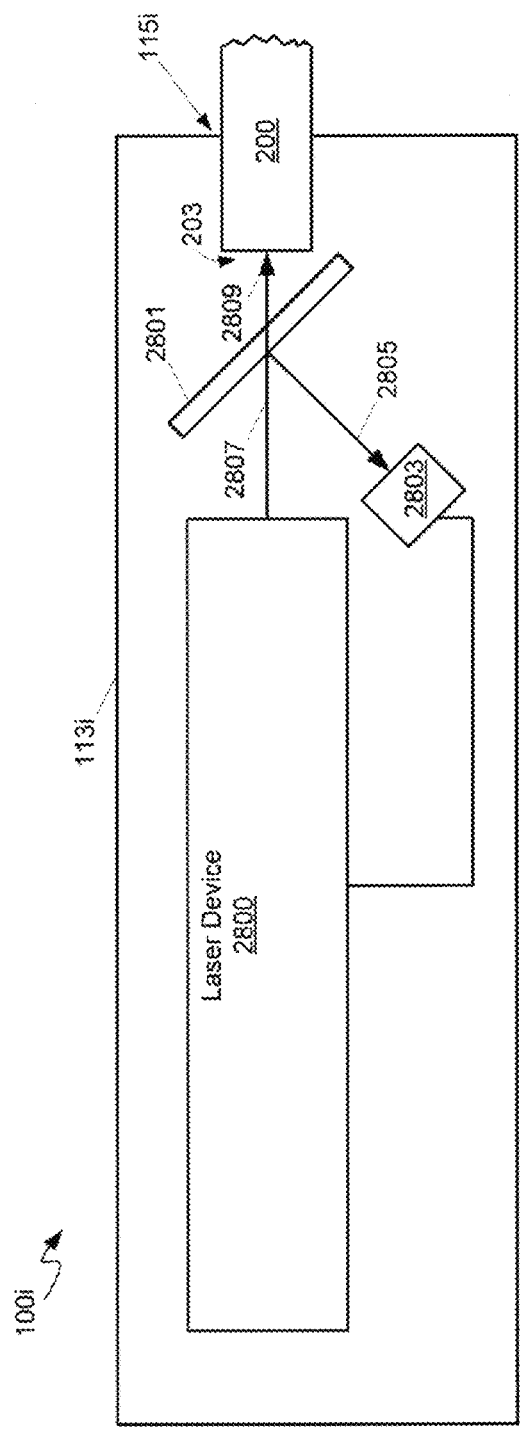
FIG. 28 depicts a schematic diagram of a discretely tunable laser device with a monitor for monitoring one or more of power and wavelength properties, according to non-limiting implementations.

Yet further alternatives are within the scope of present implementations. For example, attention is next directed to FIG. 28 which depicts a discrete output laser device 100*i* comprising a laser device 2800 in packaging 113*i*, similar to packaging 113, and apparatus 115*i*, similar to apparatus 115, for receiving optical fiber 200 having input 203. Laser device 100*i* comprises any of laser devices 100-100*b* and 100*d*-100*i* with laser device 2800 comprising any suitable combination of lasers, optical filters, optical isolators, lenses etc., as described above. Hence, output from laser device 2800 comprises a dominant discrete output mode that can be modulated internally or externally. Laser device 100*i* further comprises a beam splitter 2801 and a monitor 2803 for monitoring one or more of power and waveform properties of the two different output levels of laser device 2800. In other words, beam splitter 2801 is located in an output path of laser device 2800 such that a portion 2805 of emitted light 2807 from laser device 2800 is reflected towards monitor 2803, and a remaining portion 2809 enters input 203 of optical fiber 200. Monitor 2803 interacts with portion 2805 to monitor one or more of power and waveform properties of light 2807; output from monitor 2803 can be interconnected with laser device 2800 in a feedback loop to control output of laser device 2800, for example to provide consistent power output and/or consistent wavelength output. Hence, laser device 100*i* represents an alternative implementation to laser device 100*c* which also comprises power meter 1200.

Alternatively, any of laser devices 100-100*b* and 100*d*-100*i* can be enabled to be coupled to an external monitor for monitoring one or more of the power and the waveform properties of the two different output levels. The output from the external power monitor can be interconnected with the respective laser device 100-100*b* and 100*d*-100*i* in a feedback loop to control output of the respective laser device 100-100*b* and 100*d*-100*i*.

Furthermore, while implementations have been described with regard to laser devices comprising output and/or modulated output with telecommunications uses, present implementations are not so limited. For example, output of laser devices described herein can correspond to wavelengths associated with medical devices and any other suitable device and/or use.

In any event, described herein are various discretely tunable locally seeded laser device which combine pairs of tunable Fabry-Perot lasers, and the like, having discrete output modes, with a first one of the lasers seeding a second one of the lasers such that there is one dominant discrete output mode. The dominant discrete output mode can be selected by selecting the spacing between the respective output modes such that only one of each of the respective output modes are substantially aligned in any given position, and then tuning one or more of the lasers to select the dominant discrete output mode. Alternatively, an optical filter can be placed between the lasers to select a dominant mode of the first laser to seed the second laser. Either way, the dominant discrete output mode can be modulated by controlling drive current at one or more of the lasers. The lasers and optional optical filter can be packaged in a single device. By eliminating moving parts in present laser devices, they can be manufactured for significantly less cost than other mechanically tuned lasers, whether internally or externally modulated. In addition, in present optical communication devices, in the absence of a tunable laser, a unique laser must be used for each unique desired wavelength; for example, in ITU-grid compatible devices, a plurality of different lasers must be used, one for each wavelength in a telecommunications band, and hence each different laser must be uniquely sourced and stored. For example, the number of different lasers can range between 2 and 160 in some optical communications systems. Present implementations eliminate a need to source a unique laser for each wavelength as each unique laser can be replaced with a single laser as described herein tuned to a given wavelength. Overhead costs of sourcing, tracking, and maintaining an inventory of a plurality of unique lasers are hence also reduced.

Persons skilled in the art will appreciate that there are yet more alternative implementations and modifications possible, and that the above examples are only illustrations of one or more implementations. The scope, therefore, is only to be limited by the claims appended hereto.

What is claimed is:

1. A discretely tunable laser device comprising:
    a laser comprising a plurality of discrete output modes;
    an optical filter configured to receive output from the laser and further configured to prevent one or more of reflected light and emitted light from the optical filter reaching the laser, the optical filter comprising a plurality of transmission peaks, each separated by a transmission spacing different from a spacing of the plurality of discrete output modes such that only one discrete output mode can predominantly align with one transmission peak when the plurality of discrete output modes are tuned, the spacing of the plurality of discrete output modes is determined by one of:
        $G*(N-1)/N$;
        $G*(N+1)/N$;
        an integer multiple of one of $G*(N-1)/N$ and $G*(N+1)/N$; and, a subset of modes defined by one of G*(N−1)/N and G*(N+1)/N, wherein G is the transmission spacing of the plurality of transmission peaks of the optical filter and N is the number of the plurality of transmission peaks of the optical filter in an output band of the discretely tunable laser device; and, a control apparatus configured to tune the discrete output modes of the laser to align a given output mode of the plurality of discrete output modes with a given transmission peak of the plurality of transmission peaks, such that the given output mode comprises a dominant output of the optical filter.

2. The discretely tunable laser device of claim 1, wherein the laser comprises one or more of a Fabry-Perot Laser and a quantum dot laser.

3. The discretely tunable laser device of claim 1, wherein the optical filter comprises one or more of a passive filter and an etalon.

4. The discretely tunable laser device of claim 1, wherein the optical filter comprises a tunable filter.

5. The discretely tunable laser device of claim 4, further comprising a second control apparatus configured to tune the plurality of transmission peaks at the tunable filter to further align the given output mode with the given transmission peak.

6. The discretely tunable laser device of claim 1, further comprising an optical isolator located between the laser and the optical filter, the optical isolator configured to prevent the one or more of the reflected light and the emitted light from the optical filter reaching the laser.

7. The discretely tunable laser device of claim 1, wherein an input area of the optical filter is at an off-normal angle to the laser to prevent the one or more of the reflected light and the emitted light from the optical filter reaching the laser.

8. The discretely tunable laser device of claim 7, further comprising an absorber configured to absorb one or more of the reflected light and emitted light.

9. The discretely tunable laser device of claim 8, further comprising packaging configured to contain the laser, the optical filter and at least a portion of the control apparatus, the inside of the packaging comprising the absorber.

10. The discretely tunable laser device of claim 1, further comprising a lens between the laser and the optical filter, the lens configured to collimate the light from the laser into the optical filter.

11. The discretely tunable laser device of claim 1, further comprising a lens located after an output of the optical filter, the lens configured to focus emitted light from the optical filter.

12. The discretely tunable laser device of claim 1, further comprising apparatus configured to couple the discretely tunable laser device to an optical fiber, wherein light emitted from the optical filter is focussed onto an area where an end of the optical fiber is to be located to be received as input by the optical fiber.

13. The discretely tunable laser device of claim 1, wherein the control apparatus comprises a thermo-electric cooler.

14. The discretely tunable laser device of claim 1, wherein the control apparatus comprises a thermo-electric cooler and a processor, the processor configured to control the thermo-electric cooler to a setting associated with the given output mode aligning with the given transmission peak.

15. The discretely tunable laser device of claim 1, wherein the discretely tunable laser device at least one of: further comprises a power monitor for configured to monitor light emitted from the optical filter in a feedback loop with the control apparatus; and, is configured to be coupled to an external power monitor.

16. The discretely tunable laser device of claim 15, wherein the control apparatus is configured to:

tune the discrete output modes of the laser to align the given output mode with the given transmission peak;

receive data from one or more of the power monitor and the external power monitor; and, further tune the discrete output modes of the laser to improve alignment of the given output mode with the given transmission peak by determining a local maximum of one or more of the power monitor and the external power monitor.

17. The discretely tunable laser device of claim 15, wherein the power monitor comprises a tap coupler.

18. The discretely tunable laser device of claim 1, wherein each of the plurality of transmission peaks corresponds to modes in one or more of a communications band, and a medical device band.

19. The discretely tunable laser device of claim 1, further comprising a wavelength monitor configured to monitor a wavelength of light emitted from the optical filter.

20. The discretely tunable laser device of claim 1, further comprising an optical amplifier configured to optically amplify light emitted from the optical filter.

* * * * *